United States Patent
Hwang et al.

(10) Patent No.: US 9,419,176 B2
(45) Date of Patent: Aug. 16, 2016

(54) THREE-DIMENSIONAL LIGHT-EMITTING DEVICE AND FABRICATION METHOD THEREOF

(71) Applicant: SAMSUNG ELECTRONICS CO., LTD., Suwon-si (KR)

(72) Inventors: Kyung-wook Hwang, Hwaseong-si (KR); Han-kyu Seong, Seoul (KR); Hun-jae Chung, Yongin-si (KR); Nam-goo Cha, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/651,974

(22) PCT Filed: Dec. 16, 2013

(86) PCT No.: PCT/KR2013/011675
§ 371 (c)(1),
(2) Date: Jun. 12, 2015

(87) PCT Pub. No.: WO2014/092517
PCT Pub. Date: Jun. 19, 2014

(65) Prior Publication Data
US 2015/0325745 A1    Nov. 12, 2015

(30) Foreign Application Priority Data
Dec. 14, 2012    (KR) .................. 10-2012-0146618

(51) Int. Cl.
*H01L 33/16* (2010.01)
*H01L 33/06* (2010.01)
(Continued)

(52) U.S. Cl.
CPC .............. *H01L 33/16* (2013.01); *H01L 27/153* (2013.01); *H01L 33/0054* (2013.01); *H01L 33/0075* (2013.01); *H01L 33/06* (2013.01);
(Continued)

(58) Field of Classification Search
None
See application file for complete search history.

(56) References Cited

U.S. PATENT DOCUMENTS

| 6,372,608 | B1 | 4/2002 | Shimoda et al. |
| 6,645,830 | B2 | 11/2003 | Shimoda et al. |

(Continued)

FOREIGN PATENT DOCUMENTS

| JP | 2008-277651 A | 11/2008 |
| JP | 2012-138639 A | 7/2012 |

(Continued)

OTHER PUBLICATIONS

International Search Report for PCT/KR2013/011675 dated Mar. 25, 2014 [PCT/ISA/210].

*Primary Examiner* — Scott B Geyer
(74) *Attorney, Agent, or Firm* — Sughrue Mion, PLLC

(57) ABSTRACT

A three-dimensional (3D) light-emitting device may include a plurality of 3D light-emitting structures formed apart from one another, each 3D light-emitting structure including: a semiconductor core vertically grown on one surface and doped in a first conductive type; an active layer formed so as to surround a surface of the semiconductor core; and a first semiconductor layer formed so as to surround a surface of the active layer and doped in a second conductive type. The 3D light-emitting device may include: a first porous insulating layer formed between lower corner portions of the 3D light-emitting structures so as to expose upper end portions of the 3D light-emitting structures; a first electrode electrically connected to the first semiconductor layer; and a second electrode electrically connected to the semiconductor core.

29 Claims, 24 Drawing Sheets

(51) Int. Cl.
  H01L 27/15 (2006.01)
  H01L 33/40 (2010.01)
  H01L 33/42 (2010.01)
  H01L 33/00 (2010.01)
  H01L 33/62 (2010.01)
  H01L 33/24 (2010.01)
  H01L 33/08 (2010.01)
  H01L 33/20 (2010.01)

(52) U.S. Cl.
  CPC ............. *H01L 33/08* (2013.01); *H01L 33/24* (2013.01); *H01L 33/405* (2013.01); *H01L 33/42* (2013.01); *H01L 33/62* (2013.01); *H01L 33/20* (2013.01); *H01L 2933/0016* (2013.01); *H01L 2933/0066* (2013.01)

(56) References Cited

U.S. PATENT DOCUMENTS

| | | | |
|---|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,063,410 B2 | 11/2011 | Fudeta |
| 8,129,711 B2 | 3/2012 | Kang et al. |
| 8,179,938 B2 | 5/2012 | Kim |
| 8,263,987 B2 | 9/2012 | Choi et al. |
| 8,319,243 B2 | 11/2012 | Fudeta |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 2004/0127035 A1* | 7/2004 | Lee .................. H01L 21/02203 438/689 |
| 2008/0237619 A1* | 10/2008 | Epler ...................... H01L 33/16 257/98 |
| 2010/0006817 A1 | 1/2010 | Ohlsson et al. |
| 2010/0276664 A1 | 11/2010 | Hersee |

FOREIGN PATENT DOCUMENTS

| KR | 10-2012-0040550 A | 4/2012 |
|---|---|---|
| KR | 10-2013-0025716 A | 3/2013 |

\* cited by examiner

THREE-DIMENSIONAL LIGHT-EMITTING DEVICE AND FABRICATION METHOD THEREOF

CROSS-REFERENCE TO RELATED APPLICATION

This application claims the benefit of Korean Patent Application No. 10-2012-0146618, filed on Dec. 14, 2012, in the Korean Intellectual Property Office, the disclosure of which is incorporated herein in its entirety by reference.

BACKGROUND

The inventive concept relates to a light-emitting device and a fabrication method thereof, and more particularly, to a three-dimensional (3D) light-emitting device and a fabrication method thereof.

A light-emitting device emits light according to the combination of electrons and holes injected into an active layer made of a compound semiconductor. However, since a plurality of crystal defects exist in the active layer made of a compound semiconductor, when electrons and holes are combined through the crystal defects, thermal energy is emitted instead of optical energy. Accordingly, the light-emitting efficiency of the light-emitting device decreases, and thus, there is a demand for various techniques capable of improving the decrease in the light-emitting efficiency of the light-emitting device.

SUMMARY

The inventive concept provides a three-dimensional (3D) light-emitting device including 3D light-emitting structures capable of increasing the light-emitting efficiency of the 3D light-emitting device and having good insulating characteristics between the 3D light-emitting structures.

The inventive concept also provides a novel method of fabricating the 3D light-emitting device.

According to an aspect of the inventive concept, there is provided a three-dimensional (3D) light-emitting device including a plurality of 3D light-emitting structures formed apart from one another, each 3D light-emitting structure including: a semiconductor core vertically grown on one surface and doped in a first conductive type; an active layer formed so as to surround a surface of the semiconductor core; and a first semiconductor layer formed so as to surround a surface of the active layer and doped in a second conductive type.

The 3D light-emitting device may include: a first porous insulating layer formed between lower corner portions of the 3D light-emitting structures so as to expose upper end portions of the 3D light-emitting structures; a first electrode electrically connected to the first semiconductor layer; and a second electrode electrically connected to the semiconductor core.

The 3D light-emitting device may further include a mask layer having a plurality of through-holes formed apart from one another, wherein the semiconductor core is grown in the vertical direction through a corresponding through-hole.

A first etching prevention layer may be formed below the mask layer.

A second porous insulating layer may be formed below the mask layer.

A second etching prevention layer may be formed below the second porous insulating layer.

A reflection metal layer or a transparent electrode layer may be formed so as to cover the first semiconductor layer forming the 3D light-emitting structure.

The first porous insulating layer may be formed by being filled between the lower corner portions of the 3D light-emitting structures or be formed on lower one-side walls of the 3D light-emitting structures.

The semiconductor core may be vertically grown on the surface of a second semiconductor layer doped in the first conductive type.

A reflection metal layer may be formed below the second semiconductor layer.

The second semiconductor layer may be formed on a first substrate.

The components formed on the first substrate may be flip-chip bonded onto a second substrate by turning the first substrate over.

An uneven structure may be formed on the second semiconductor layer between the first substrate and the second semiconductor layer.

According to another aspect of the inventive concept, there is provided a three-dimensional (3D) light-emitting device including a plurality of 3D light-emitting structures formed apart from one another and exposing lower corner portions of semiconductor cores, each 3D light-emitting structure including: a semiconductor core vertically grown on one surface and doped in a first conductive type; an active layer formed so as to surround a surface of the semiconductor core; and a first semiconductor layer formed so as to surround a surface of the active layer and doped in a second conductive type.

The 3D light-emitting device may include: a porous insulating layer formed between lower corner portions of the 3D light-emitting structures, which include the exposed lower corner portions of the semiconductor cores, so as to expose upper end portions of the 3D light-emitting structures; a first electrode electrically connected to the first semiconductor layer; and a second electrode electrically connected to the semiconductor core.

An etching prevention layer may be formed below the porous insulating layer.

A vertical cross-section of the 3D light-emitting structure may have a triangular or quadrangular shape.

According to another aspect of the inventive concept, there is provided a method of fabricating a (3D) light-emitting device, the method including: forming a plurality of 3D light-emitting structures apart from one another, each 3D light-emitting structure including a semiconductor core vertically grown on one surface and doped in a first conductive type, an active layer formed so as to surround a surface of the semiconductor core, and a first semiconductor layer formed so as to surround a surface of the active layer and doped in a second conductive type; forming a first porous insulating layer between lower corner portions of the 3D light-emitting structures in an electrochemical method so as to expose upper end portions of the 3D light-emitting structures; forming a first electrode electrically connected to the first semiconductor layer; and forming a second electrode electrically connected to the semiconductor core.

The semiconductor core may be formed by forming a mask layer having a plurality of through-holes formed on the one surface and apart from one another and growing a semiconductor core material in the vertical direction through the through-hole.

A first etching prevention layer may be further formed below the mask layer.

A second porous insulating layer may be further formed below the mask layer.

A second etching prevention layer may be further formed below the second porous insulating layer.

A reflection metal layer or a transparent electrode layer may be further formed so as to cover the first semiconductor layer forming the 3D light-emitting structure.

The first porous insulating layer may be formed by being filled between the lower corner portions of the 3D light-emitting structures or be formed on lower one-side walls of the 3D light-emitting structures.

The semiconductor core may be vertically grown on the surface of a second semiconductor layer doped in the first conductive type.

A reflection metal layer may be further formed below the second semiconductor layer.

The second semiconductor layer may be formed on a first substrate.

The components formed on the first substrate may be flip-chip bonded onto a second substrate by turning the first substrate over.

An uneven structure may be formed on the second semiconductor layer between the first substrate and the second semiconductor layer.

The forming of the first porous insulating layer may include: forming a third semiconductor layer, which covers the 3D light-emitting structures and is doped with impurities having an impurity density that is higher than that of the first semiconductor layer; forming a third semiconductor layer pattern doped with impurities so as to fill between the lower corner portions of the 3D light-emitting structures and expose the upper end portions of the 3D light-emitting structures by electrochemically etching the third semiconductor layer doped with impurities; and changing the third semiconductor layer pattern doped with impurities to the first porous insulating layer by electrochemically etching the third semiconductor layer pattern doped with impurities.

An extent of exposing the upper end portions of the 3D light-emitting structures by etching the third semiconductor layer doped with impurities may be adjusted according to the impurity density of the third semiconductor layer and a voltage value and a current value applied in the electrochemical etching.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
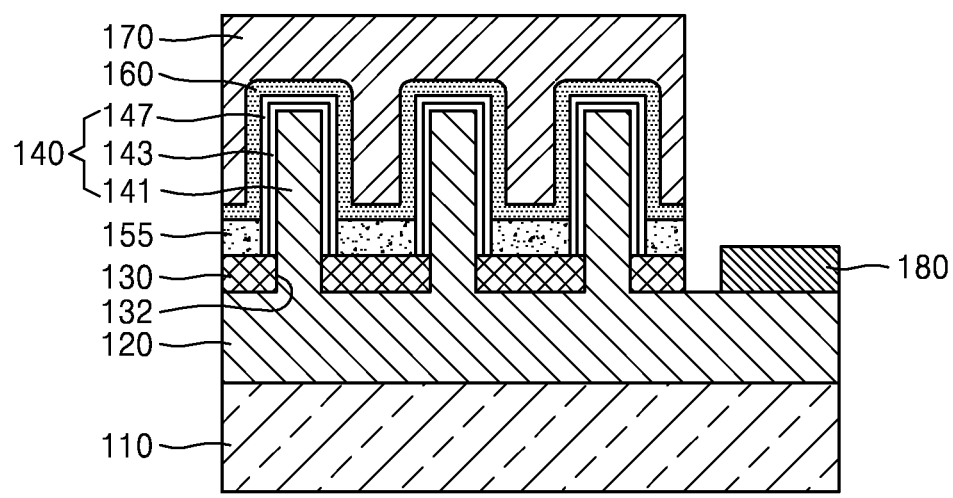
FIG. 1 is a cross-sectional diagram of a 3D light-emitting device according to an embodiment of the inventive concept.

The inventive concept will now be described more fully with reference to the accompanying drawings, in which exemplary embodiments of the inventive concept are shown.

Like reference numerals in the drawings denote like elements, and thus their repetitive description will be omitted.

The embodiments are provided to describe the inventive concept more fully to those of ordinary skill in the art. The embodiments may, however, be embodied in many different forms and should not be construed as being limited to the embodiments set forth herein; rather, these embodiments are provided so that this disclosure will be thorough and complete, and will fully convey the concept of the inventive concept to those of ordinary skill in the art.

Although terms, such as 'first' and 'second', are used in the specification to describe various members, regions, layers, parts and/or elements, it is obvious that these members, regions, layers, parts and/or elements cannot be limited by the terms. The terms do not indicate a specific sequence, top and bottom, or superior and inferior and are only used to classify a certain member, region, part, or element from another member, region, part, or element. Therefore, a first member, region, part, or element to be described below can be named a second member, region, part, or element without leaving the introduction of the inventive concept. For example, the first element can be named the second element without leaving from the right scope of the inventive concept, and likely the second element can be named the first element.

All terms used herein including technical or scientific terms have the same meaning as those generally understood by those of ordinary skill in the art unless they are defined differently. It should be understood that terms generally used, which are defined in a dictionary, have the same meaning as in context of related technology, and the terms are not understood as ideal or excessively formal meaning unless they are clearly defined in the application.

When a certain embodiment can be differently implemented, a specific process order may be differently carried out from a described order. For example, two consecutive processes in the description may be carried out substantially at the same time or in an order that is opposite to the described order.

In the drawings, modifications of the shown shapes can be predicted according to, for example, a manufacturing technique and/or tolerance. Therefore, it should not be understood that the embodiments of the inventive concept are limited to the specific shapes of regions illustrated in the specification, and the embodiments of the inventive concept should include, for example, a change in shapes caused according to manufacturing. The embodiments below may be implemented alone or in combination.

FIG. 1 is a cross-sectional diagram of a 3D light-emitting device 100 according to an embodiment of the inventive concept.

Referring to FIG. 1, the 3D light-emitting device 100 may include a plurality of 3D light-emitting structures 140 formed apart from one another. The 3D light-emitting structures 140 may have a nano-size ($10^{-9}$ m) diameter or width. The 3D light-emitting structures 140 may be grown from a second semiconductor layer 120. Each of the 3D light-emitting structures 140 may be a light-emitting nanorod, a light-emitting nanopyramid, or the like in view of a structural shape. The vertical cross-sections of the 3D light-emitting structures 140 may have a cross-sectional shape of a circle, an oval, or a polygon, e.g., a triangle or a quadrangle, or the like. For convenience, FIG. 1 illustrates that the vertical cross-section of the 3D light-emitting structures 140 has a quadrangular shape.

The excitation wavelengths emitted by the 3D light-emitting structures 140 may be red, green, and blue wavelengths.

Accordingly, the 3D light-emitting device 100 may be a monochromatic light-emitting device, i.e., a white light-emitting device.

Each of the 3D light-emitting structures 140 may include a semiconductor core 141 formed by being doped in a first conductive type, e.g., an n type, an active layer 143 which surrounds a surface of the semiconductor core 141, and a first semiconductor layer 147 which surrounds a surface of the active layer 143 and is doped in a second conductive type, e.g., a p type, that is opposite to the first conductive type. The semiconductor core 141 may have a nano-size diameter or width. The semiconductor core 141 may be a semiconductor nanorod, a semiconductor nanopyramid, or the like in view of a structural shape.

A porous insulating layer 155 may be formed so as to fill between lower corner portions of the 3D light-emitting structures 140 and to expose upper end portions of the 3D light-emitting structures 140. The lower corner portions of the 3D light-emitting structures 140 may indicate regions adjacent to portions at which an upper surface of a mask layer 130 meets the 3D light-emitting structures 140. A reflection metal layer 160 may be formed so as to cover the first semiconductor layer 147 of each the 3D light-emitting structures 140, which is exposed by the porous insulating layer 155. A thick-film metal layer 170 may be formed on the reflection metal layer 160.

A substrate 110 is a growth substrate for growing a semiconductor monocrystal, and a silicon (Si) substrate, a silicon carbide (SiC) substrate, a sapphire substrate, or the like may be used for the substrate 110. For the substrate 110, a substrate formed of a material suitable for the growth of the second semiconductor layer 120 to be formed on the substrate 110, e.g., zinc oxide (ZnO), gallium arsenide (GaAs), magnesium-aluminum oxide ($MgAl_2O_4$), magnesium oxide (MgO), lithium-aluminum oxide ($LiAlO_2$), lithium-gallium oxide ($LiGaO_2$), gallium nitride (GaN), or the like, may be used.

The second semiconductor layer 120 may be provided on the substrate 110. The second semiconductor layer 120 is a semiconductor layer doped in the first conductive type and may be formed of a group III-V nitride semiconductor material. For example, the second semiconductor layer 120 may be formed of a semiconductor material including aluminum-gallium-indium nitride ($Al_xGa_yIn_zN$: $0 \leq x \leq 1$, $0 \leq y \leq 1$, $0 \leq z \leq 1$, and $x+y+z=1$) doped with n-type impurities. Si, germanium (Ge), selenium (Se), tellurium (Te), and the like may be used for the n-type impurities. The second semiconductor layer 120 may be formed by a method such as hydride vapor phase epitaxy (HVPE), molecular beam epitaxy (MBE), metal organic vapor phase epitaxy (MOVPE), metal organic chemical vapor deposition (MOCVD), or the like.

The mask layer 130 may be formed on the second semiconductor layer 120 and have a plurality of through-holes 132. The mask layer 130 may be formed of silicon oxide or silicon nitride as an insulating material. For example, the mask layer 130 may be formed of silicon oxide ($SiO_2$), silicon nitride (SiN), titanium oxide ($TiO_2$), silicon nitride ($Si_3N_4$), aluminum oxide ($Al_2O_3$), titanium nitride (TiN), aluminum nitride (AlN), zirconium oxide ($ZrO_2$), titanium-aluminum nitride (TiAlN), titanium-silicon nitride (TiSiN), or the like. The mask layer 130 may be formed by forming a film formed of the insulating material described above on the second semiconductor layer 120 and etching desired through-holes 132 by a lithographic process. The through-holes 132 may have a cross-sectional shape, e.g., a circle, an oval, a polygon, or the like.

Although not shown, a buffer layer necessary for epitaxy growth may be further formed between the substrate 110 and the second semiconductor layer 120 according to circumstances, and the second semiconductor layer 120 may be plural in number. The second semiconductor layer 120 may be omitted according to circumstances.

The semiconductor core 141 may be formed of the same semiconductor material as the second semiconductor layer 120. For example, the semiconductor core 141 may be formed of n-$Al_xGa_yIn_zN$ ($0 \leq x \leq 1$, $0 \leq y \leq 1$, $0 \leq z \leq 1$, and $x+y+z=1$). The semiconductor core 141 may have a shape vertically grown on a surface of the second semiconductor layer 120 through the through-hole 132 formed in the mask layer 130 and may have a cross-sectional shape of a circle, an oval, a polygon, e.g., a triangle or a quadrangle, or the like according to a cross-sectional shape of the through-hole 132. In addition, although FIG. 1 illustrates that a width of the semiconductor core 141 protruding from the through-hole 132 is the same as a width of the through-hole 132, this is only illustrative, and the width of the semiconductor core 141 may be formed somewhat wider or narrower than the width of the through-hole 132.

The active layer 143 may be formed in a shape covering the surface of the semiconductor core 141. The active layer 143 is a layer for emitting light by electron-hole recombination and may be formed as a single-quantum well or multi-quantum well structure made by adjusting a band gap according to a periodic change in x, y, and z values of $Al_xGa_yIn_zN$. For example, a quantum well structure may be formed by a pair of a quantum well layer and a barrier layer in the form of InGaN/GaN, InGaN/InGaN, InGaN/AlGaN, or InGaN/InAlGaN, and an excitation wavelength band may be adjusted by controlling band gap energy according to a molar fraction of In in an InGaN layer. When the molar fraction of In changes by about 1%, an excitation wavelength is shifted by about 5 nm.

The first semiconductor layer 147 may be provided in a shape covering the surface of the active layer 143. The first semiconductor layer 147 may be a layer doped with second conductive-type, e.g., p-type, impurities. The first semiconductor layer 147 may be formed of p-$Al_xGa_yIn_zN$ ($0 \leq x \leq 1$, $0 \leq y \leq 1$, $0 \leq z \leq 1$, and $x+y+z=1$), and Mg, Zn, beryllium (Be), or the like may be used for the p-type impurities.

The porous insulating layer 155 may be provided to reduce leakage in the lower corner portions of the 3D light-emitting structures 140. The porous insulating layer 155 may be a GaN layer or Si layer. The porous insulating layer 155 may be formed by being filled between the 3D light-emitting structures 140. The porous insulating layer 155 may be formed at portions between the 3D light-emitting structures 140 so as to cover the lower corner portions of the 3D light-emitting structures 140 and the upper surface of the mask layer 130. The porous insulating layer 155 may be a passivation layer for insulating the 3D light-emitting structures 140 from one another.

The porous insulating layer 155 may be formed by an electrochemical method. The porous insulating layer 155 may be formed by forming the 3D light-emitting structures 140, continuously forming an electrochemically etchable semiconductor layer doped with impurities, and electrochemically etching the semiconductor layer doped with impurities to remove conductivity from the semiconductor layer doped with impurities. This will be described in detail below.

The reflection metal layer 160 may be formed so as to cover the first semiconductor layer 147 of each of the 3D light-emitting structures 140, which is exposed by the porous insulating layer 155, and be electrically connected to the first semiconductor layer 147. The reflection metal layer 160 may be formed so as to cover an upper surface of the porous insulating layer 155 and 3D light-emitting structures 140. The reflection metal layer 160 may act as a first electrode, e.g., a p electrode. The reflection metal layer 160 may be formed of a material including silver (Ag). For example, the reflection metal layer 160 may be formed by coating a material including Ag, Ag/nickel (Ni), or Ag/platinum (Pt) using sputtering method or the like.

The thick-film metal layer 170 may be further formed on the reflection metal layer 160. The thick-film metal layer 170 may be formed by electroplating. The thick-film metal layer 170 may be formed more thicker than the reflection metal layer 160 and may have a flat surface through a surface polishing process. The thick-film metal layer 170 may also be used as the first electrode. Since the thick-film metal layer 170 may be used as a support layer, the 3D light-emitting structures 140 may be prevented from being destroyed or cracked.

A second electrode 180 may be formed on the second semiconductor layer 120 so as to apply a voltage for injecting electrons and holes to the active layer 143. The second electrode 180 may be formed of Ti, Al, tantalum (Ta), chromium (Cr), carbide (C), Ag, or the like. The second electrode 180 may be obtained by forming a pattern on the polished surface of the thick-film metal layer 170 by using photoresist or the like at a point where the thick-film metal layer 170 has been formed, exposing the second semiconductor layer 120 by wet and dry etching methods, and forming the second electrode 180, e.g., an n electrode, on the exposed surface of the second semiconductor layer 120.

According to the 3D light-emitting device 100, since light generated by the active layer 143 of each of the 3D light-emitting structures 140 is spontaneously emitted, the generated light is oriented in all directions without a particular directivity, wherein light traveling upwards is reflected from an interface between the 3D light-emitting structures 140 and the reflection metal layer 160 and travels downwards, and a combination structure of the 3D light-emitting structures 140 and the reflection metal layer 160 acts as a waveguide. Thus, light having good directivity may be emitted from a lower surface of the 3D light-emitting device 100. In addition, the intensity of the light emitted from the lower surface of the 3D light-emitting device 100 may be increased by providing an electrode, i.e., the reflection metal layer 160, including a metal having good reflectivity, e.g., Ag, on an upper surface of the 3D light-emitting device 100, and moreover, since the reflection metal layer 160 has an uneven structure, light extraction efficiency may increase. In addition, since a contact area between the 3D light-emitting structures 140 and the reflection metal layer 160 acting as the first electrode is large, a light-emitting area is large, and thus luminance efficiency is good, and since an area of the reflection metal layer 160, i.e., an upper-surface metal electrode, is large, a heat-dissipation effect is good.

Since light from the 3D light-emitting device 100 is emitted towards the substrate 110, the substrate 110 may be processed in various shapes, such as a lens and the like, through a patterning process according to circumstances or processed to obtain a texturing effect so as to increase the light extraction efficiency of the 3D light-emitting device 100. The substrate 110 may be removed according to circumstances after fabricating the 3D light-emitting device 100.

Figure 2:
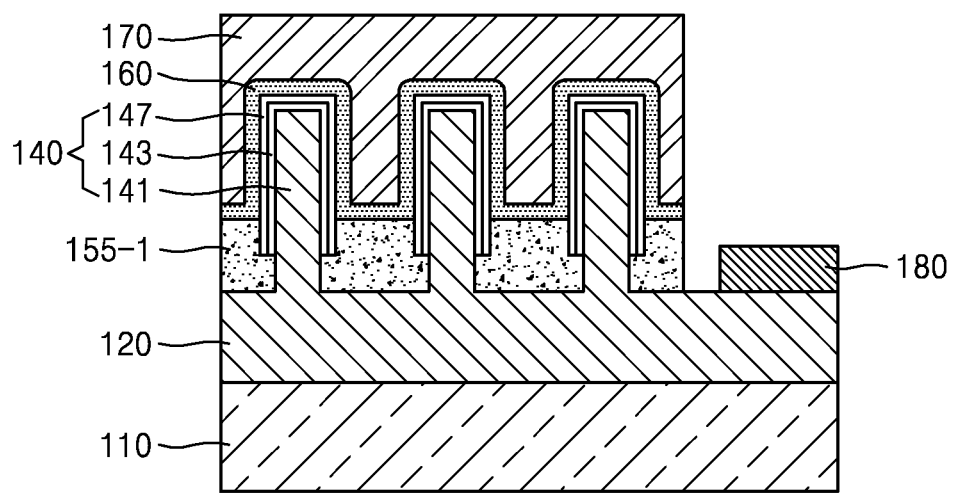
FIG. 2 is a cross-sectional diagram of a 3D light-emitting device according to another embodiment of the inventive concept.

FIG. 2 is a cross-sectional diagram of a 3D light-emitting device 100-1 according to another embodiment of the inventive concept.

In detail, compared with the 3D light-emitting device 100 of FIG. 1, the 3D light-emitting device 100-1 of FIG. 2 is the same as the 3D light-emitting device 100 of FIG. 1 except for removing the mask layer 130 and forming a porous insulating layer 155-1 between semiconductor cores 141.

The porous insulating layer 155-1 may be formed on the second semiconductor layer 120 and filled between the 3D light-emitting structures 140 and between the semiconductor cores 141. The porous insulating layer 155-1 may be formed so as to cover the lower corner portions of the 3D light-emitting structures 140, lower corner portions of the semiconductor cores 141, and an upper surface of the second semiconductor layer 120.

In other words, the lower corner portions of the semiconductor cores 141 in the 3D light-emitting device 100-1 may be exposed, and the porous insulating layer 155-1 may be formed between the exposed lower corner portions of the semiconductor cores 141. The porous insulating layer 155-1 may be formed so as to cover lower portions of first semiconductor layers 147 and active layers 143 between the semiconductor cores 141, e.g., a portion of the lower portions of the first semiconductor layers 147 and the active layers 143, on the second semiconductor layer 120. The lower corner portions of the semiconductor cores 141 may indicate an area adjacent to a portion where the upper surface of the second semiconductor layer 120 meets lower portions of the semiconductor cores 141. The porous insulating layer 155-1 may be formed by an electrochemical method.

In the 3D light-emitting device 100-1, since the porous insulating layer 155-1 is formed on the second semiconductor layer 120 and fill between the 3D light-emitting structures 140 and between the semiconductor cores 141, leakage from the lower corner portions of the 3D light-emitting structures 140 and the semiconductor cores 141 may be more readily reduced.

Figure 3:
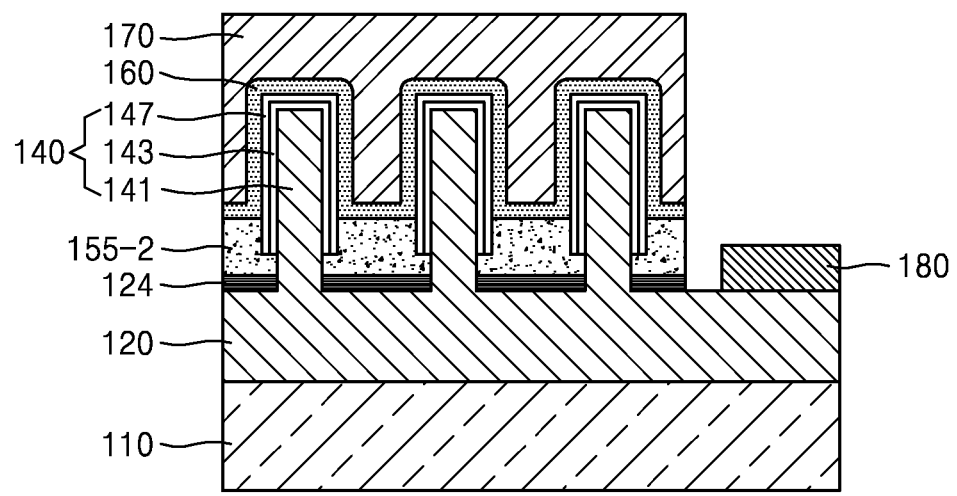
FIG. 3 is a cross-sectional diagram of a 3D light-emitting device according to another embodiment of the inventive concept.

FIG. 3 is a cross-sectional diagram of a 3D light-emitting device 100-2 according to another embodiment of the inventive concept.

In detail, compared with the 3D light-emitting device 100-1 of FIG. 2, the 3D light-emitting device 100-2 of FIG. 3 is the same as the 3D light-emitting device 100-1 of FIG. 2 except for forming an etching prevention layer 124 below a porous insulating layer 155-2. The etching prevention layer 124 may be formed of GaN, AlN, SiC, or the like without being doped with impurities.

The porous insulating layer 155-2 may be formed on the etching prevention layer 124 and filled between the 3D light-emitting structures 140 and between the semiconductor cores 141. The porous insulating layer 155-2 may be formed so as to cover the lower corner portions of the 3D light-emitting structures 140, the lower corner portions of the semiconductor cores 141, and an upper surface of the etching prevention layer 124. The porous insulating layer 155-2 may be formed by an electrochemical method as the porous insulating layer 155-1 described above.

In the 3D light-emitting device 100-2, since the porous insulating layer 155-2 is formed on the second semiconductor layer 120 and filled between the 3D light-emitting structures 140 and between the semiconductor cores 141, leakage from the lower corner portions of the 3D light-emitting structures 140 and the semiconductor cores 141 may be more readily reduced.

In the 3D light-emitting device 100-2, through-holes (132-1 of FIG. 21b) for forming the semiconductor cores 141 may be more accurately formed due to the etching prevention layer 124 in a fabricating process, as described below. Accordingly, heights and uniformity of the semiconductor cores 141 may be more accurately formed. This will be described in more detail below.

Figure 4:
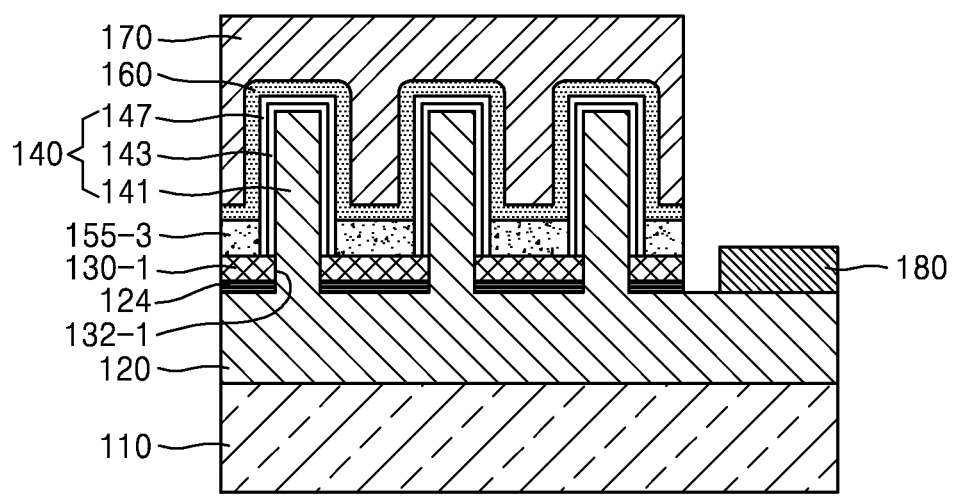
FIG. 4 is a cross-sectional diagram of a 3D light-emitting device according to another embodiment of the inventive concept.

FIG. 4 is a cross-sectional diagram of a 3D light-emitting device 100-3 according to another embodiment of the inventive concept.

In detail, compared with the 3D light-emitting device 100 of FIG. 1, the 3D light-emitting device 100-3 of FIG. 4 is the same as the 3D light-emitting device 100 of FIG. 1 except for forming an etching prevention layer 124 below a mask layer 130-1. In addition, compared with the 3D light-emitting device 100-2 of FIG. 3, the 3D light-emitting device 100-3 of FIG. 4 is the same as the 3D light-emitting device 100-2 of FIG. 3 except for further forming the mask layer 130-1 on the etching prevention layer 124.

The semiconductor cores 141 may be grown in the vertical direction through through-holes 132-1 formed in the mask layer 130-1 and the etching prevention layer 124. The mask layer 130-1 and the etching prevention layer 124 may be formed on the lower corner portions of the semiconductor cores 141. A porous insulating layer 155-3 may be formed on the mask layer 130-1 and filled between the 3D light-emitting structures 140. The porous insulating layer 155-3 may be formed so as to cover the lower corner portions of the 3D light-emitting structures 140 and an upper surface of the mask layer 130-1.

In the 3D light-emitting device 100-3, since the mask layer 130-1, the etching prevention layer 124, and the porous insulating layer 155-3 are formed on the second semiconductor layer 120 and filled between the 3D light-emitting structures 140 and between the semiconductor cores 141, leakage from the lower corner portions of the 3D light-emitting structures 140 and the semiconductor cores 141 may be more readily reduced.

In the 3D light-emitting device 100-3, the mask layer 130-1 for forming the semiconductor cores 141 may be more clearly patterned due to the etching prevention layer 124 in a fabricating process as described with reference to FIG. 3. Accordingly, the densities and heights of the semiconductor cores 141 may be uniformly formed.

Figure 5:
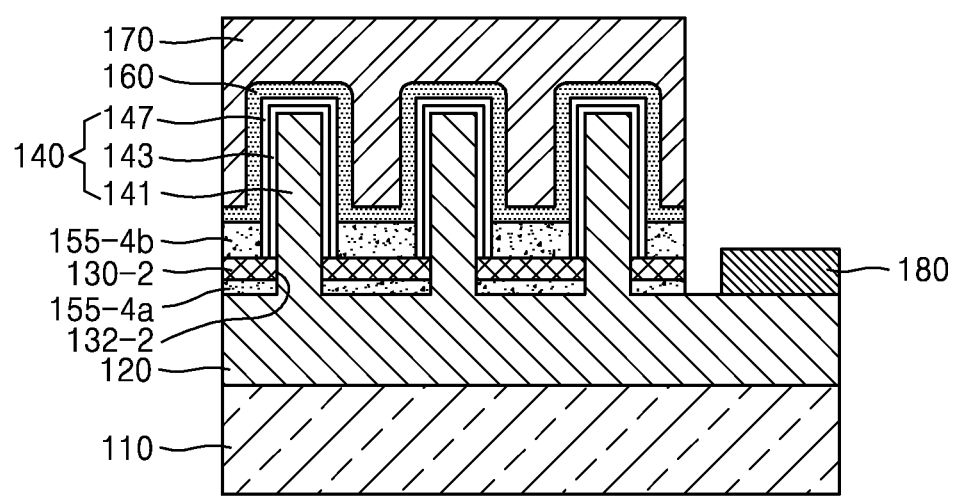
FIG. 5 is a cross-sectional diagram of a 3D light-emitting device according to another embodiment of the inventive concept.

FIG. 5 is a cross-sectional diagram of a 3D light-emitting device 100-4 according to another embodiment of the inventive concept.

In detail, compared with the 3D light-emitting device 100-3 of FIG. 4, the 3D light-emitting device 100-4 of FIG. 5 is the same as the 3D light-emitting device 100-3 of FIG. 4 except for forming a second porous insulating layer 155-4a instead of the etching prevention layer 124.

The semiconductor cores 141 may be grown in the vertical direction through through-holes 132-2 formed in a mask layer 130-2 and the second porous insulating layer 155-4a. The mask layer 130-2 and the second porous insulating layer 155-4a may be formed on the lower corner portions of the semiconductor cores 141. A first porous insulating layer 155-4b may be formed on the mask layer 130-2 and filled between the 3D light-emitting structures 140. The first porous insulating layer 155-4b may be formed so as to cover the lower corner portions of the 3D light-emitting structures 140 and an upper surface of the mask layer 130-2.

In the 3D light-emitting device 100-4, since the mask layer 130-2 and the second and first porous insulating layers 155-4a and 155-4b are formed on the second semiconductor layer 120 and filled between the 3D light-emitting structures 140 and between the semiconductor cores 141, leakage from the lower corner portions of the 3D light-emitting structures 140 and the semiconductor cores 141 may be more readily reduced.

Figure 6:
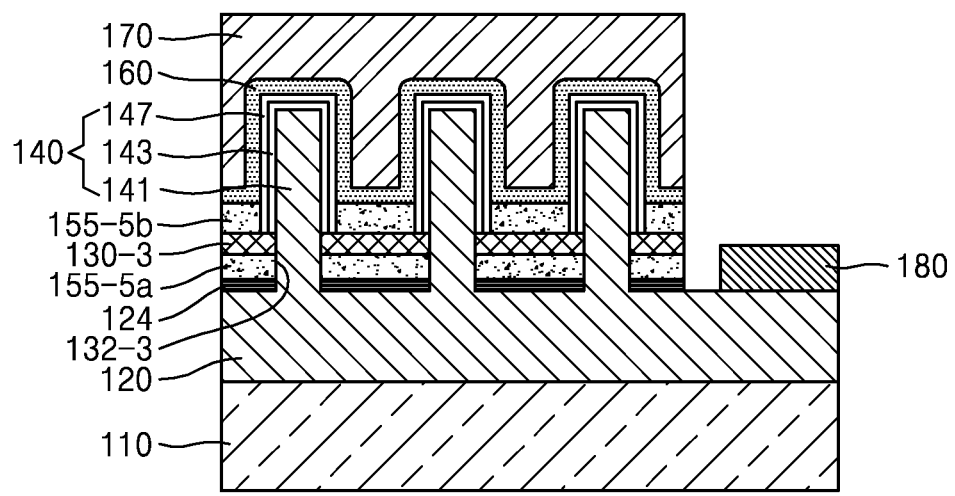
FIG. 6 is a cross-sectional diagram of a 3D light-emitting device according to another embodiment of the inventive concept.

FIG. 6 is a cross-sectional diagram of a 3D light-emitting device 100-5 according to another embodiment of the inventive concept.

In detail, compared with the 3D light-emitting device 100-4 of FIG. 5, the 3D light-emitting device 100-5 of FIG. 6 is the same as the 3D light-emitting device 100-4 of FIG. 5 except for further forming the etching prevention layer 124 below a second porous insulating layer 155-5*a*.

The semiconductor cores 141 may be grown in the vertical direction through through-holes 132-3 formed in the etching prevention layer 124, the second porous insulating layer 155-5*a*, and a mask layer 130-3. The etching prevention layer 124, the second porous insulating layer 155-5*a*, and the mask layer 130-3 may be formed on the lower corner portions of the semiconductor cores 141. A first porous insulating layer 155-5*b* may be formed on the mask layer 130-3 and filled between the 3D light-emitting structures 140. The first porous insulating layer 155-5*b* may be formed so as to cover the lower corner portions of the 3D light-emitting structures 140 and an upper surface of the mask layer 130-3.

In the 3D light-emitting device 100-5, since the etching prevention layer 124, the mask layer 130-3, and the second and first porous insulating layer 155-5*a* and 155-5*b* are formed on the second semiconductor layer 120 and filled between the 3D light-emitting structures 140 and between the semiconductor cores 141, leakage from the lower corner portions of the 3D light-emitting structures 140 and the semiconductor cores 141 may be more readily reduced.

In the 3D light-emitting device 100-5, the mask layer 130-3 for forming the semiconductor cores 141 may be more clearly patterned due to the etching prevention layer 124 in a fabricating process. Accordingly, the densities and heights of the semiconductor cores 141 may be uniformly formed.

Figure 7:
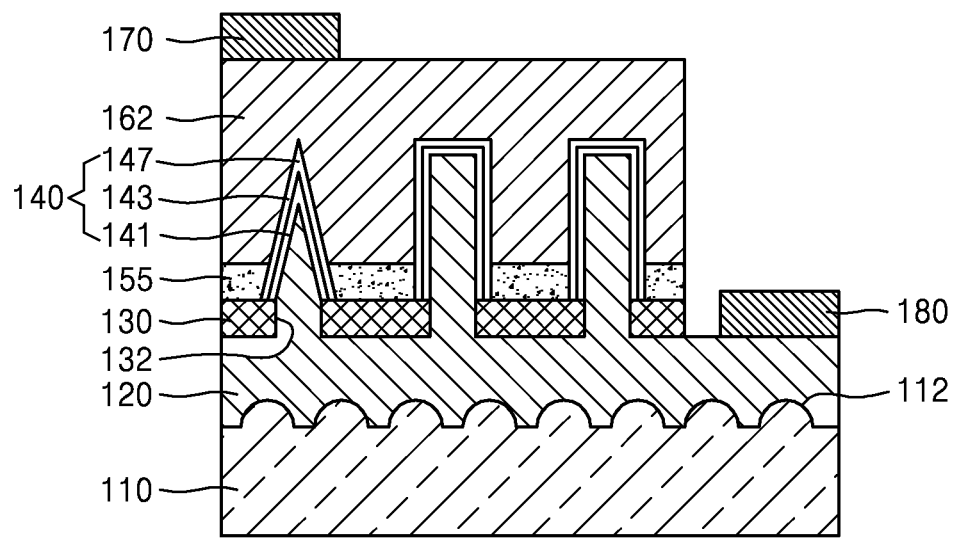
FIG. 7 is a cross-sectional diagram of a 3D light-emitting device according to another embodiment of the inventive concept.

FIG. 7 is a cross-sectional diagram of a 3D light-emitting device 100-6 according to another embodiment of the inventive concept.

In detail, compared with the 3D light-emitting device 100 of FIG. 1, the 3D light-emitting device 100-6 of FIG. 7 is the same as the 3D light-emitting device 100 of FIG. 1 except that a vertical cross-section of one 3D light-emitting structure 140 has a triangular shape, a vertical cross-section of each of the other 3D light-emitting structures 140 has a quadrangular shape, a transparent electrode layer 162 is formed so as to cover the 3D light-emitting structures 140, and an uneven structure 112 is formed between the substrate 110 and the second semiconductor layer 120.

Compared with the 3D light-emitting device 100 of FIG. 1, in the 3D light-emitting device 100-6 of FIG. 7, a vertical cross-section of some of the 3D light-emitting structures 140 may have a triangular shape. Since a vertical cross-section of a semiconductor core 141 has a triangular shape when the semiconductor core 141 is grown, the vertical cross-section of one 3D light-emitting structure 140 may also have a triangular shape. Since the 3D light-emitting device 100-6 of FIG. 7 includes the transparent electrode layer 162, light may be emitted through an upper surface of the 3D light-emitting device 100-6. The transparent electrode layer 162 may be formed of Ni/indium tin oxide (ITO), Ni/gold (Au)/ITO, ITO, Ni/ZnO, ZnO, or the like.

In the 3D light-emitting device 100-6 of FIG. 7, leakage may be reduced by forming the porous insulating layer 155 between the 3D light-emitting structures 140, as described above. In the 3D light-emitting device 100-6 of FIG. 7, the transparent electrode layer 162 is formed so as to cover the 3D light-emitting structures 140. Accordingly, in the 3D light-emitting device 100-6 of FIG. 7, light generated by the active layers 143 of the 3D light-emitting structures 140 may be emitted through the upper surface of the 3D light-emitting device 100-6.

In addition, in the 3D light-emitting device 100-6 of FIG. 7, the uneven structure 112 may be formed between the substrate 110 and the second semiconductor layer 120, thereby improving light extraction efficiency. The uneven structure 112 may be or may not be formed according to circumstances.

Figure 8:
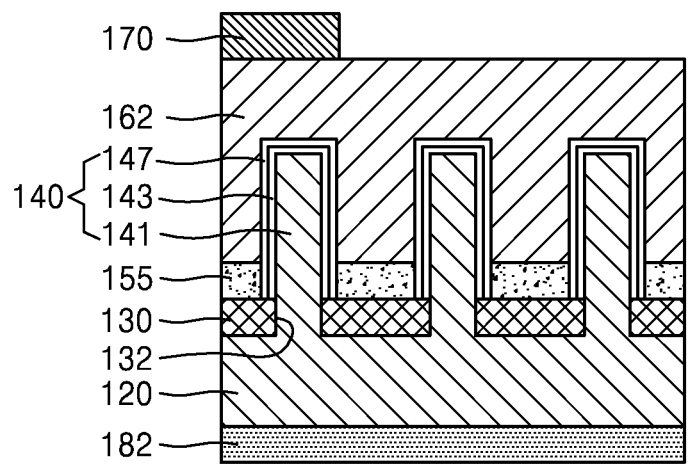
FIG. 8 is a cross-sectional diagram of a 3D light-emitting device according to another embodiment of the inventive concept.

FIG. 8 is a cross-sectional diagram of a 3D light-emitting device 100-7 according to another embodiment of the inventive concept.

In detail, compared with the 3D light-emitting device 100-6 of FIG. 7, the 3D light-emitting device 100-7 of FIG. 8 is the same as the 3D light-emitting device 100-6 of FIG. 7 except that a vertical cross-section of some of the 3D light-emitting structures 140 does not have a triangular shape, and a reflection metal layer 182 is formed below the second semiconductor layer 120 without the substrate 110 thereon.

In the 3D light-emitting device 100-7 of FIG. 8, the reflection metal layer 182 is formed on a lower surface of the second semiconductor layer 120 without the substrate 110 thereon. The reflection metal layer 182 may act as the second electrode, e.g., an n electrode. The reflection metal layer 182 may be formed of a material including Ag. For example, the reflection metal layer 182 may be formed by coating a material including Ag, Ag/Ni, or Ag/Pt using sputtering method or the like. Accordingly, light generated by the active layers 143 of the 3D light-emitting structures 140 may be reflected from the reflection metal layer 182 and emitted through an upper surface of the 3D light-emitting device 100-7.

Figure 9:
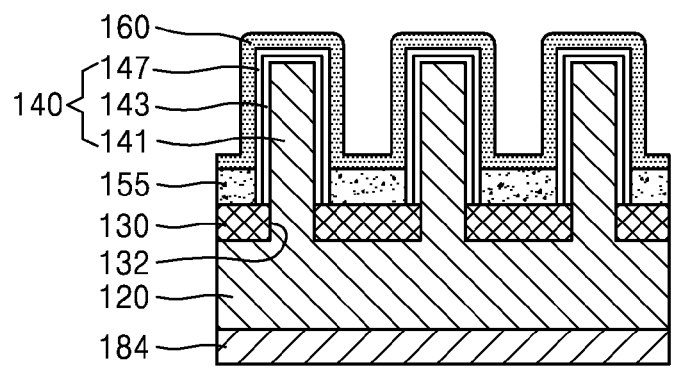
FIG. 9 is a cross-sectional diagram of a 3D light-emitting device according to another embodiment of the inventive concept.

FIG. 9 is a cross-sectional diagram of a 3D light-emitting device 100-8 according to another embodiment of the inventive concept.

In detail, compared with the 3D light-emitting device 100 of FIG. 1, the 3D light-emitting device 100-8 of FIG. 9 is the same as the 3D light-emitting device 100 of FIG. 1 except that a transparent electrode layer 184 is formed below the second semiconductor layer 120 and the substrate 110, the thick-film metal layer 170, and the second electrode 180 are not formed.

In the 3D light-emitting device 100-8 of FIG. 9, the transparent electrode layer 184 is formed below the second semiconductor layer 120 without the substrate 110 thereon. The transparent electrode layer 184 may be formed of Ni/ITO, Ni/Au/ITO, ITO, Ni/ZnO, ZnO, or the like. The reflection metal layer 160 may act as the first electrode, and the transparent electrode layer 184 may act as the second electrode. Accordingly, light generated by the active layers 143 of the 3D light-emitting structures 140 may be emitted through a lower surface of the 3D light-emitting device 100-8.

Figure 10A:
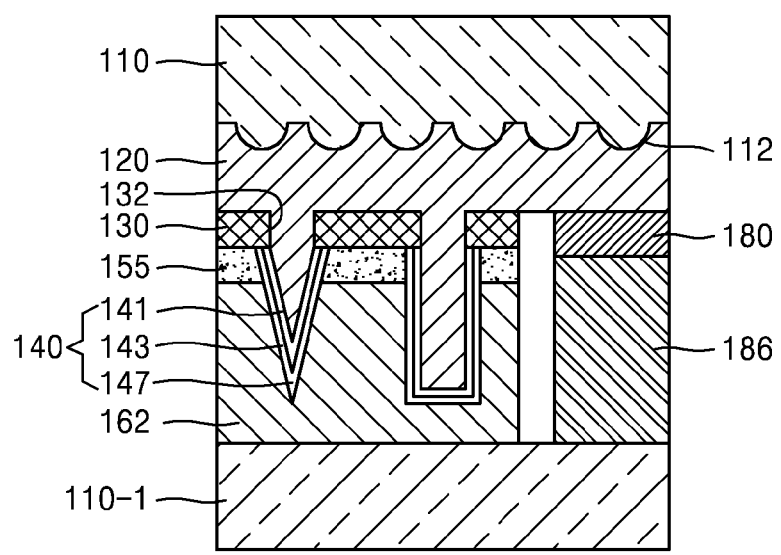
FIGS. 10A and 10B are cross-sectional diagrams of 3D light-emitting devices according to other embodiments of the inventive concept.

FIG. 10A is a cross-sectional diagram of a 3D light-emitting device 100-9*a* according to another embodiment of the inventive concept.

In detail, compared with the 3D light-emitting device 100-6 of FIG. 7, the 3D light-emitting device 100-9*a* of FIG. 10A is the same as the 3D light-emitting device 100-6 of FIG. 7 except that the transparent electrode layer 162 is flip-chip bonded onto a second substrate 110-1 by turning a first substrate 110 over.

In the 3D light-emitting device 100-9*a* of FIG. 10A, only two 3D light-emitting structures 140 are illustrated for convenience, and the transparent electrode layer 162 may be flip-chip bonded onto the second substrate 110-1 by turning the first substrate 110 over. The second substrate 110-1 may be formed of the same material as the first substrate 110. The second substrate 110-1 may be a package substrate. The second substrate 110-1 may be an impurity-doped substrate including any one selected from Au, Ni, Al, copper (Cu), tungsten (W), Si, Se, and GaAs. The second substrate 110-1 may be an Al-doped Si substrate. The transparent electrode layer 162 may act as the first electrode. A support conductor 186 may be formed on the second electrode 180.

In the 3D light-emitting device 100-9a of FIG. 10A, leakage may be reduced by forming the porous insulating layer 155 between the 3D light-emitting structures 140, as described above, and light generated by the active layers 143 of the 3D light-emitting structures 140 may be emitted through a lower surface of the 3D light-emitting device 100-9a via the transparent electrode layer 162.

In the 3D light-emitting device 100-9a of FIG. 10A, the uneven structure 112 may be formed between the first substrate 110 and the second semiconductor layer 120, thereby improving light extraction efficiency. The uneven structure 112 may be formed according to circumstances. When the uneven structure 112 is not formed between the first substrate 110 and the second semiconductor layer 120, an uneven structure (not shown) may be formed on the first substrate 110 to thereby improve light extraction efficiency (do they mean? The uneven structure 112 may be formed between the first substrate 110 and the second semiconductor layer 120 to thereby improve light extraction efficiency.

Figure 10B:
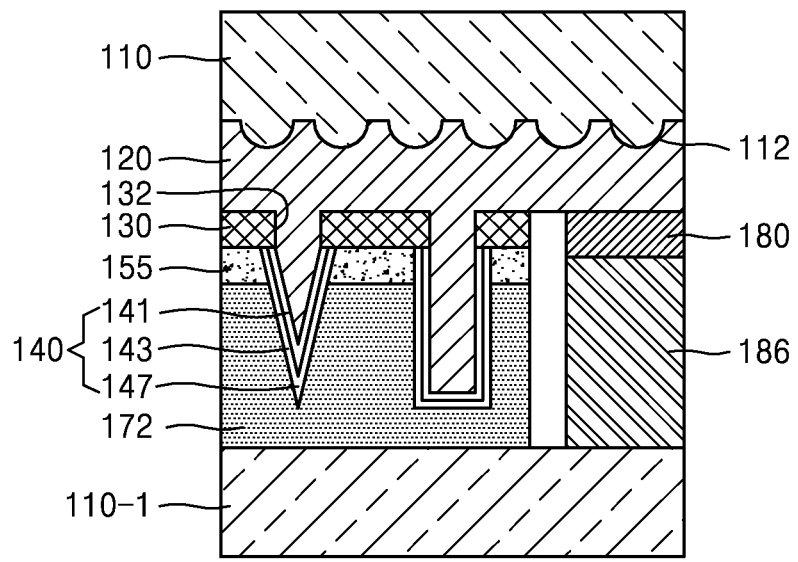

FIG. 10B is a cross-sectional diagram of a 3D light-emitting device 100-9b according to another embodiment of the inventive concept.

In detail, compared with the 3D light-emitting device 100-9a of FIG. 10A, the 3D light-emitting device 100-9b of FIG. 10B is the same as the 3D light-emitting device 100-9a of FIG. 10B except for forming a reflection electrode layer 172 instead of the transparent electrode layer 162. The reflection electrode layer 172 may be formed as a metal layer, e.g., Ag, Ag/Ni, Ag/Pt, or the like.

In the 3D light-emitting device 100-9b of FIG. 10B, the reflection electrode layer 172 may act as the first electrode. In the 3D light-emitting device 100-9b of FIG. 10B, light generated by the active layers 143 of the 3D light-emitting structures 140 may be emitted through an upper surface of the 3D light-emitting device 100-9b due to the reflection electrode layer 172.

Figure 11A:
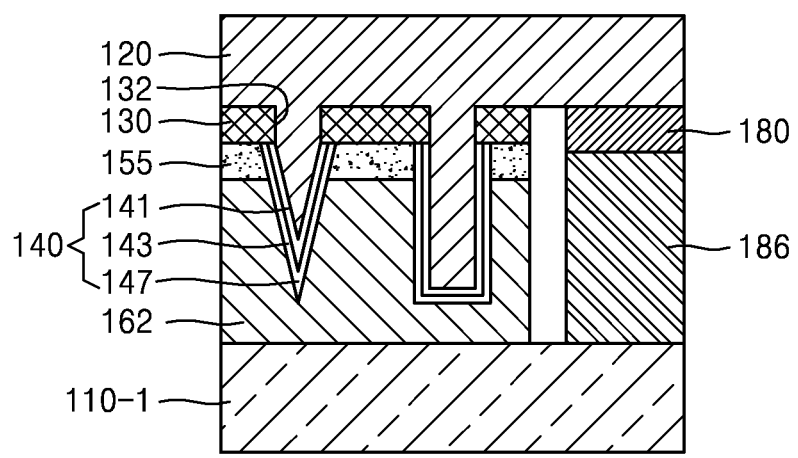
FIGS. 11A and 11B are cross-sectional diagrams of 3D light-emitting devices according to other embodiments of the inventive concept.

FIG. 11A is a cross-sectional diagram of a 3D light-emitting device 100-10a according to another embodiment of the inventive concept.

In detail, compared with the 3D light-emitting device 100-9a of FIG. 10A, the 3D light-emitting device 100-10a of FIG. 11A is the same as the 3D light-emitting device 100-9a of FIG. 10B except that the first substrate 110 is removed and no uneven structure is formed.

In the 3D light-emitting device 100-10a of FIG. 11A, the transparent electrode layer 162 is flip-chip bonded onto the second substrate 110-1 by turning the first substrate 110 over. Thereafter, the first substrate 110 is removed. The transparent electrode layer 162 may act as the first electrode. The support conductor 186 may be formed on the second electrode 180.

In the 3D light-emitting device 100-10a of FIG. 11A, leakage may be reduced by forming the porous insulating layer 155 between the 3D light-emitting structures 140, and light generated by the active layers 143 of the 3D light-emitting structures 140 may be emitted through a lower surface of the 3D light-emitting device 100-10a. According to circumstances, an uneven structure (not shown) may be formed on the second semiconductor layer 120, thereby improving light extraction efficiency.

Figure 11B:
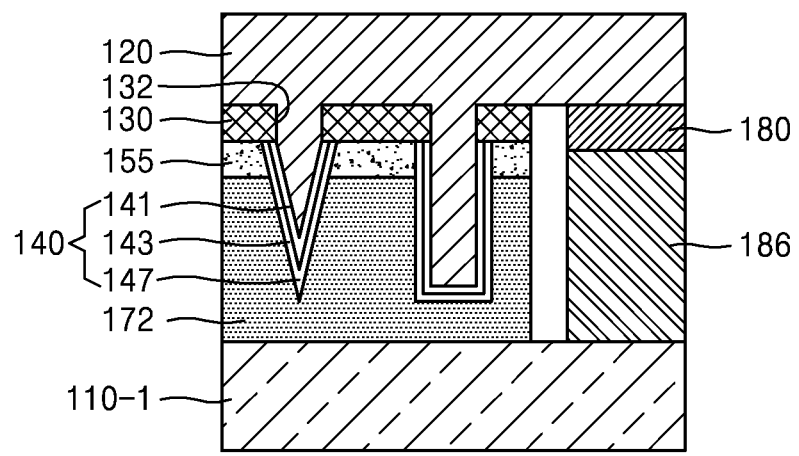

FIG. 11B is a cross-sectional diagram of a 3D light-emitting device 100-10b according to another embodiment of the inventive concept.

In detail, compared with the 3D light-emitting device 100-10a of FIG. 11A, the 3D light-emitting device 100-10b of FIG. 11B is the same as the 3D light-emitting device 100-10a of FIG. 11B except for forming the reflection electrode layer 172 instead of the transparent electrode layer 162. The reflection electrode layer 172 may be formed as a metal layer, e.g., Ag, Ag/Ni, Ag/Pt, or the like.

In the 3D light-emitting device 100-9b of FIG. 10B, the reflection electrode layer 172 may act as the first electrode. In the 3D light-emitting device 100-9b of FIG. 10B, light generated by the active layers 143 of the 3D light-emitting structures 140 may be emitted through an upper surface of the 3D light-emitting device 100-9b due to the reflection electrode layer 172.

Figure 12A:
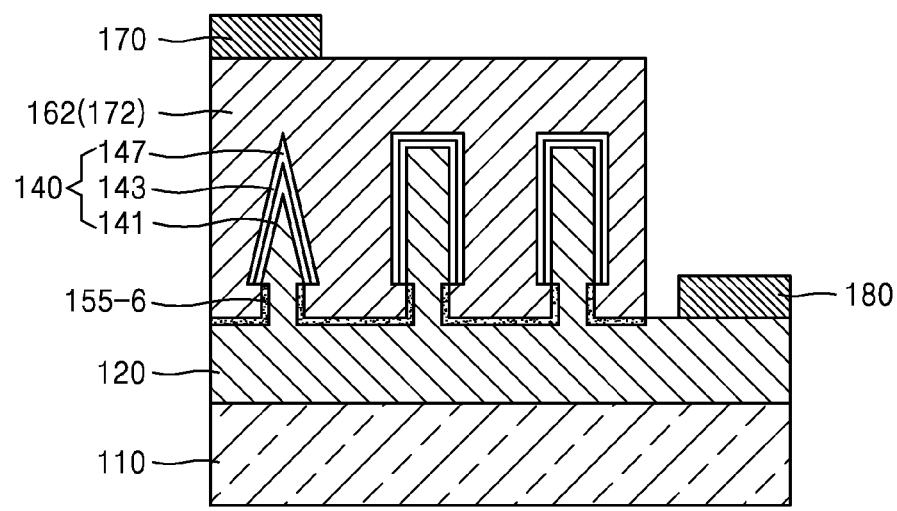
FIGS. 12A and 12B are cross-sectional diagrams of 3D light-emitting devices according to other embodiments of the inventive concept.
Figure 12B:
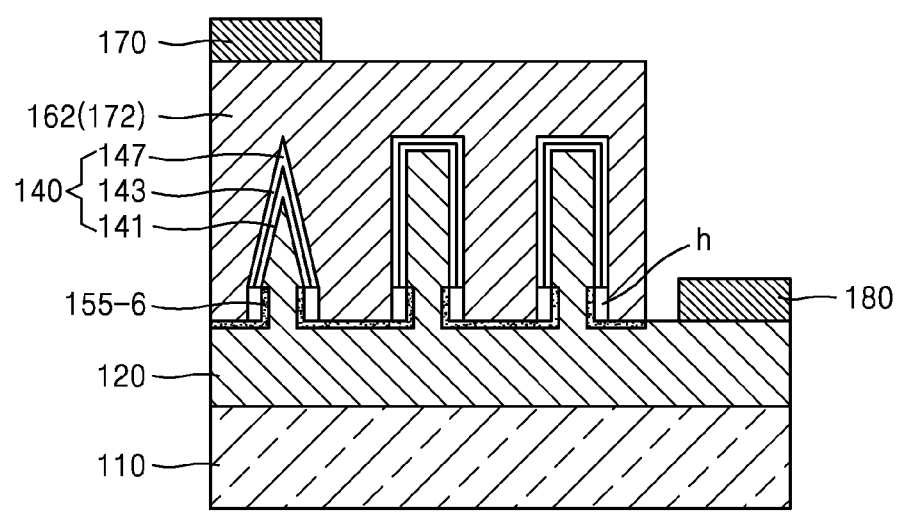

FIGS. 12A and 12B are cross-sectional diagrams of 3D light-emitting devices 100-11a and 100-11b according to other embodiments of the inventive concept.

In detail, compared with the embodiments described above, the 3D light-emitting devices 100-11a and 100-11b of FIGS. 12A and 12B are the same as the embodiments described above except for forming a porous insulating layer 155-6 on the lower corner portions of the 3D light-emitting structures 140 or the semiconductor cores 141 and on the upper surface of the second semiconductor layer 120. In other words, the porous insulating layer 155-6 is formed on the lower side walls of the 3D light-emitting structures 140 instead being filled between the lower corner portions of the 3D light-emitting structures 140 or between the lower corner portions of the semiconductor cores 141.

Since the porous insulating layer 155-6 is directly formed on the lower corner portions of the 3D light-emitting structures 140 or the semiconductor cores 141 and on the upper surface of the second semiconductor layer 120, the porous insulating layer 155-6 may be formed without a complex fabricating process. An operation of forming the porous insulating layer 155-6 will be described in detail in a fabricating method thereof below.

The transparent electrode layer 162 or the reflection electrode layer 172 for the first electrode is formed on the second semiconductor layer 120, on which the 3D light-emitting structures 140 are formed. FIG. 12B differs from FIG. 12A in that holes h may be formed since the transparent electrode layer 162 or the reflection electrode layer 172 is not filled in the lower corner portions of the semiconductor cores 141. As shown in FIGS. 12A and 12B, the second electrode 180 may be formed on the second semiconductor layer 120, thereby completely forming the 3D light-emitting devices 100-11a and 100-11b.

Figure 13A:
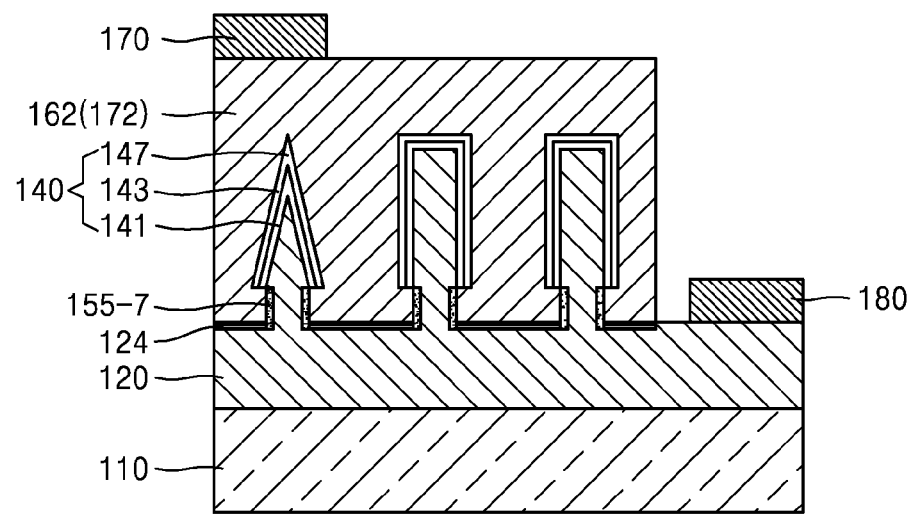
FIGS. 13A and 13B are cross-sectional diagrams of 3D light-emitting devices according to other embodiments of the inventive concept.
Figure 13B:
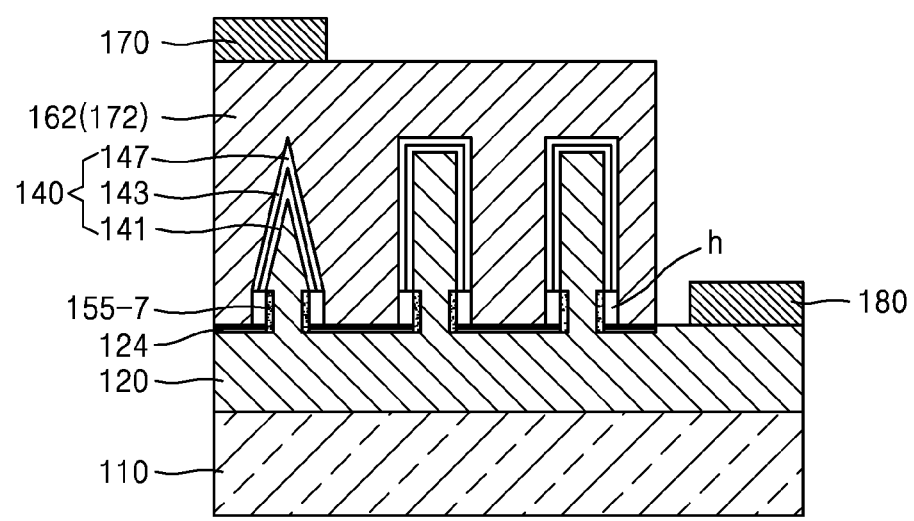

FIGS. 13A and 13B are cross-sectional diagrams of 3D light-emitting devices 100-12a and 100-12b according to other embodiments of the inventive concept.

In detail, compared with the 3D light-emitting devices 100-11a and 100-11b of FIGS. 12A and 12B, the 3D light-emitting devices 100-12a and 100-12b of FIGS. 13A and 13B are the same as the 3D light-emitting devices 100-11a and 100-11b of FIGS. 12A and 12B except for forming a porous insulating layer 155-7 on the lower corner portions of the 3D light-emitting structures 140 or the semiconductor cores 141 or on both side walls of the 3D light-emitting structures 140 or the semiconductor cores 141.

Since the porous insulating layer 155-7 is directly formed on the lower corner portions of the 3D light-emitting structures 140 or the semiconductor cores 141, the porous insulating layer 155-7 may be formed without a complex fabricating process. An operation of forming the porous insulating layer 155-7 will be described in detail in a fabricating method thereof below.

The transparent electrode layer 162 or the reflection electrode layer 172 for the first electrode is formed on the second semiconductor layer 120, on which the 3D light-emitting structures 140 are formed. FIG. 13B differs from FIG. 13A in that holes h may be formed since the transparent electrode layer 162 or the reflection electrode layer 172 is not filled in the lower corner portions of the semiconductor cores 141. As shown in FIGS. 13A and 13B, the second electrode 180 may be formed on the second semiconductor layer 120, thereby completely forming the 3D light-emitting devices 100-12a and 100-12b.

Figure 17:
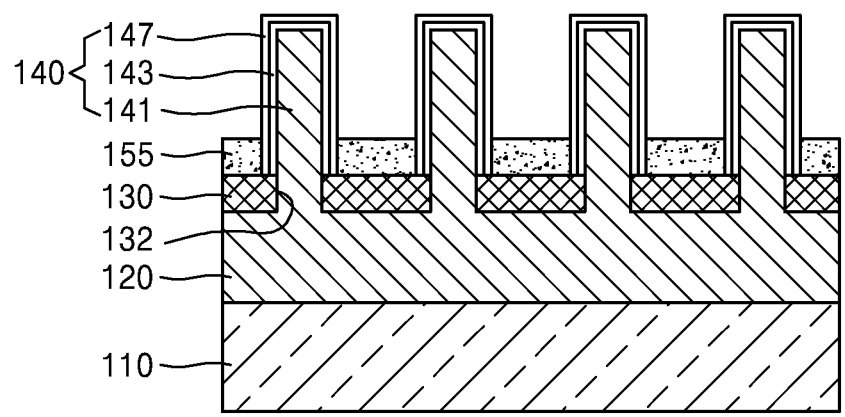
Figure 18:
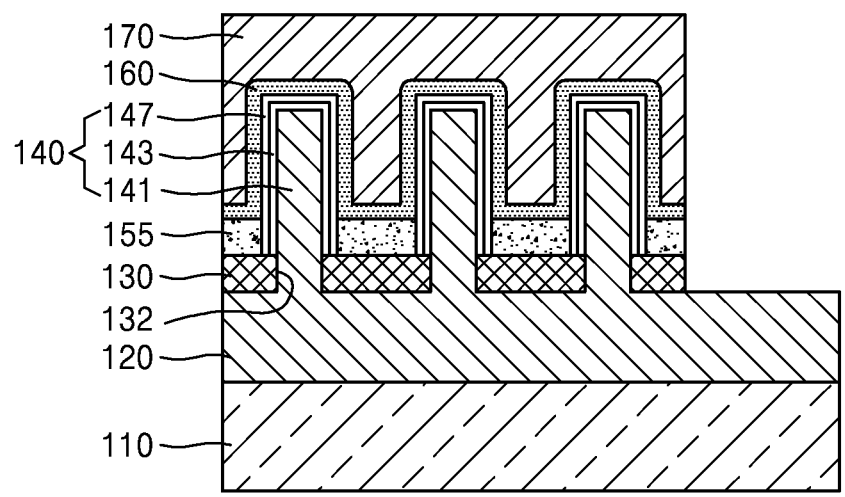
Figure 19:
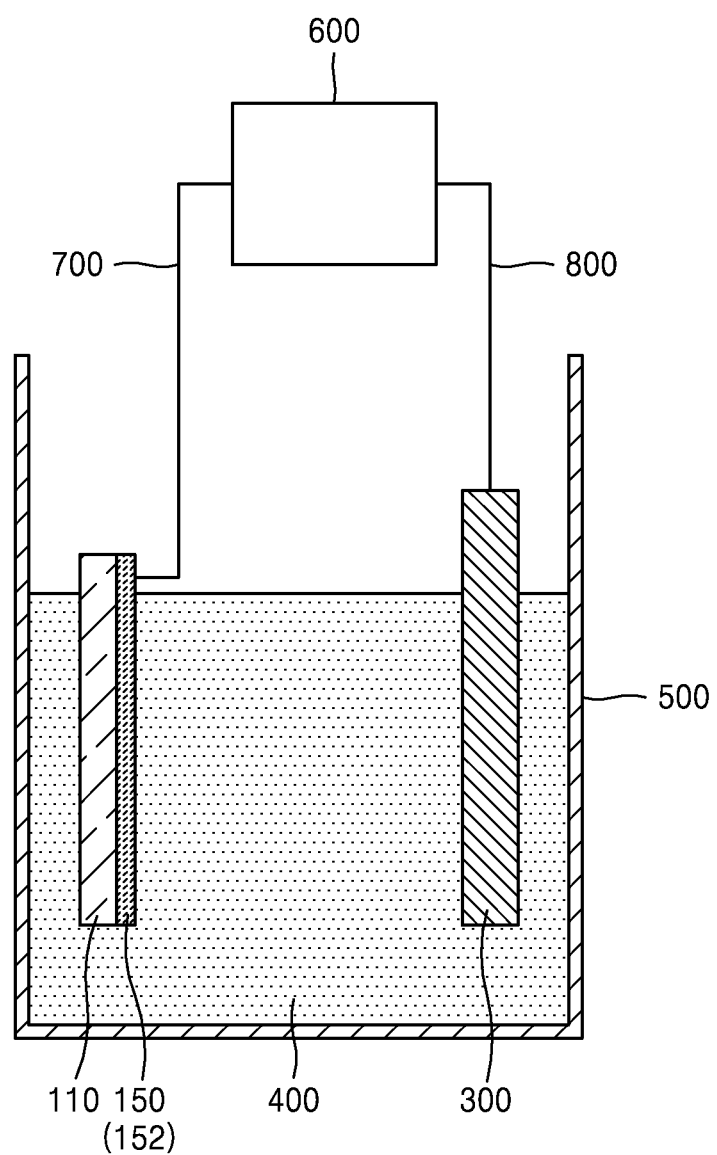
FIG. 19 is a schematic diagram of an electrochemical etching apparatus used to fabricate the 3D light-emitting device in FIG. 1, according to an embodiment of the inventive concept.

FIGS. 14 to 18 are cross-sectional diagrams for describing a method of fabricating the 3D light-emitting device 100 of FIG. 1, according to an embodiment of the inventive concept, and FIG. 19 is a schematic diagram of an electrochemical etching apparatus used to fabricate the 3D light-emitting device 100 in FIG. 1, according to an embodiment of the inventive concept.

Figure 14:
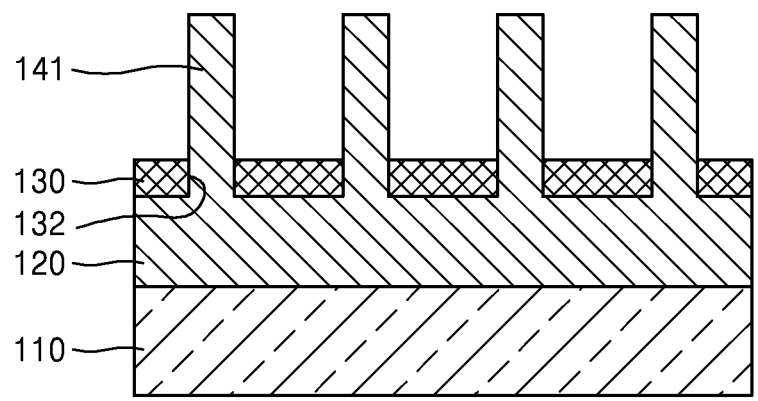
FIGS. 14 to 18 are cross-sectional diagrams for describing a method of fabricating the 3D light-emitting device in FIG. 1, according to an embodiment of the inventive concept.

Referring to FIG. 14, the mask layer 130 is formed on the substrate 110 and has the plurality of through-holes 132, and the semiconductor cores 141 doped in the first conductive type, e.g., an n type, are vertically grown through the through-holes 132. That is, the semiconductor cores 141 may be formed by growing a semiconductor core material through the through-holes 132. The second semiconductor layer 120 may be provided on the substrate 110, and thereafter, the mask layer 130 may be formed on the second semiconductor layer 120. Hereinafter, a case where the second semiconductor layer 120 is provided on the substrate 110 is illustrated.

The mask layer 130 may be formed by forming a film formed of an insulating material as described with reference to FIG. 1 on the second semiconductor layer 120 and etching a desired shape of the through-holes 132 by a lithographic process. Each of the through-holes 132 may have a cross-sectional shape, such as a circle, an oval, a polygon, e.g., a triangle or a quadrangle, or the like.

The semiconductor cores 141 may be vertically grown from the second semiconductor layer 120 through the through-holes 132 formed in the mask layer 130, and each of the semiconductor cores 141 has a cross-sectional shape, such as a circle, an oval, a polygon, e.g., a triangle or a quadrangle, or the like, according to the cross-sectional shape of its corresponding through-hole 132. Although FIG. 14 illustrates that a width of each of the semiconductor cores 141 protruding from its corresponding through-hole 132 is the same as a width of its corresponding through-hole 132, this is only illustrative, and the width of each of the semiconductor cores 141 may be formed somewhat wider or narrower than the width of its corresponding through-hole 132.

Figure 15A:
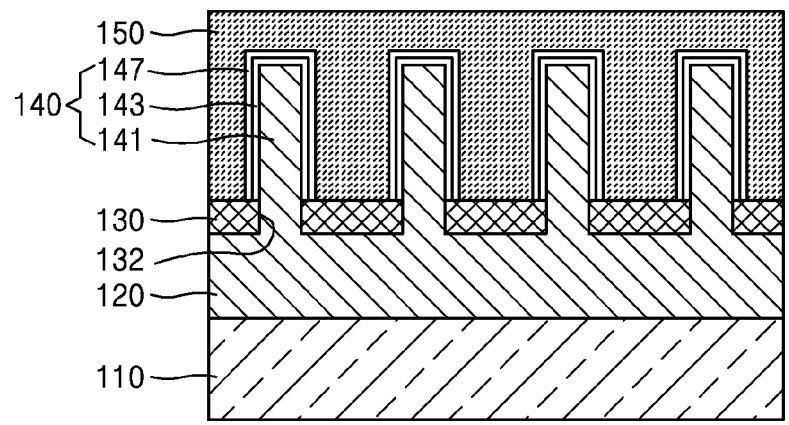
Figure 15B:
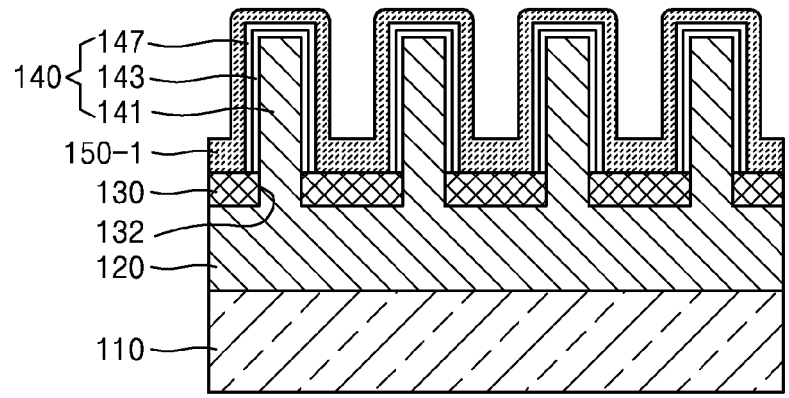

Referring to FIGS. 15A and 15B, after growing the semiconductor cores 141, an array of the 3D light-emitting structures 140 is formed by forming the active layers 143 so as to respectively surround the surfaces of the semiconductor cores 141 and forming the first semiconductor layers 147 doped in the first conductive type so as to respectively surround the surfaces of the active layers 143.

The active layers 143 may be formed in a shape respectively covering the surfaces of the semiconductor cores 141, and the first semiconductor layers 147 may be formed in a shape respectively covering the surfaces of the active layers 143. Accordingly, since the active layers 143 and the first semiconductor layers 147 are not grown on a surface of the mask layer 130 between the 3D light-emitting structures 140, the surface of the mask layer 130 between the 3D light-emitting structures 140 is exposed.

Thereafter, after forming (growing) the 3D light-emitting structures 140, a third semiconductor layer 150 or 150-1 doped with impurities of the first conductive type, e.g., an n type, or the second conductive type, e.g., a p type, is continuously formed (grown) so as to fully cover the 3D light-emitting structures 140 on the mask layer 130. The third semiconductor layer 150 or 150-1 may be formed of an electrochemically etchable semiconductor material doped with impurities. The third semiconductor layer 150 or 150-1 may be formed of a semiconductor material having an impurity density that is higher than the first semiconductor layers 147.

Since the third semiconductor layer 150 or 150-1 is formed corresponding to shapes of the 3D light-emitting structures 140, the third semiconductor layer 150 or 150-1 may be effectively formed on the lower corner portions of the 3D light-emitting structures 140. The third semiconductor layer 150 or 150-1 may be formed of a material having the same growth surface as the first semiconductor layers 147. The third semiconductor layer 150 or 150-1 may be formed of a semiconductor material of the first or second conductive type, e.g., an $n^+$ GaN layer or a $p^+$ Si layer.

As shown in FIG. 15A, the third semiconductor layer 150 may be formed so as to fully cover the surface of the mask layer 130 between the 3D light-emitting structures 140. Alternatively, as shown in FIG. 15B, the third semiconductor layer 150-1 may be formed along a bend of the 3D light-emitting structures 140 on the mask layer 130. A thickness of the third semiconductor layer 150-1 on the mask layer 130 may be thicker than thicknesses of the side walls and the upper surfaces of the 3D light-emitting structures 140 due to the bend of the 3D light-emitting structures 140.

Figure 16:
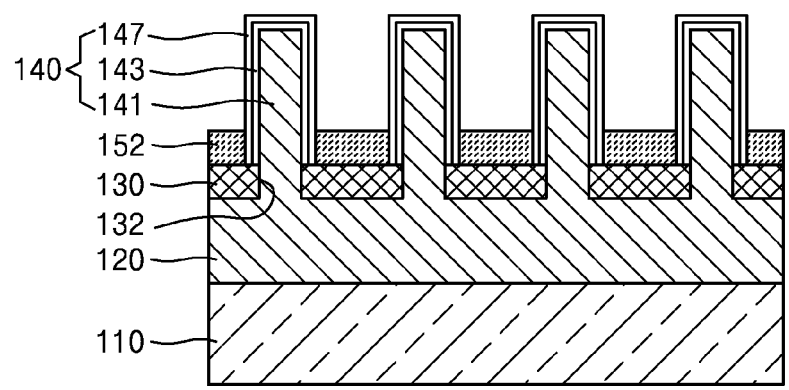

Referring to FIGS. 16, 17, and 19, as shown in FIG. 16, a third semiconductor layer pattern 152 is formed to fill between the lower corner portions of the 3D light-emitting structures 140, exposes upper end portions of the 3D light-emitting structures 140, and is doped with impurities by electrochemically etching the third semiconductor layer 150 or 150-1 doped with impurities. In other words, the upper end portions of the 3D light-emitting structures 140 are exposed by electrochemically etching the third semiconductor layer 150 or 150-1 doped with impurities.

Thereafter, as shown in FIG. 17, the third semiconductor layer pattern 152 doped with impurities is changed to the porous insulating layer 155 by electrochemically etching the third semiconductor layer pattern 152 doped with impurities. In other words, the porous insulating layer 155 is formed by electrochemically etching the third semiconductor layer pattern 152 to form vacancies therein and remove conductivity therefrom.

FIG. 19 illustrates an electrochemical etching apparatus used for the fabricating method described with reference to FIGS. 16 and 17. The electrochemical etching apparatus includes an etching bath 500 containing an etching solution 400, the substrate 110, on which the third semiconductor layer 150 is formed, which is mounted inside the etching bath 500, an opposite electrode 300, wirings 700 and 800 for connecting the third semiconductor layer 150 or 150-1, the third semiconductor layer pattern 152, and the opposite electrode 300, and a power supply device 600 for applying a voltage/current. In FIG. 19, only 150 is shown as reference numeral of the third semiconductor layer for convenience. For the etching solution 400, a hydrofluoric (HF) acid solution or an oxalic acid solution may be used. The HF acid solution may be used to etch a $p^+$ Si layer, and the oxalic acid solution may be used to etch an $n^+$ GaN layer.

With respect to FIG. 16, a first voltage value and a first current value are applied between the third semiconductor layer 150 or 150-1 and the opposite electrode 300. In this case, the third semiconductor layer pattern 152 having a proper thickness is formed on the mask layer 130 according to an etching selection ratio difference due to an impurity density difference between the first semiconductor layers 147 and the third semiconductor layer 150 or 150-1. The first voltage value and the first current value may be determined according to impurity densities of the first semiconductor layers 147 and the third semiconductor layer 150 or 150-1 or the impurity density difference between the first semiconductor layers 147 and the third semiconductor layer 150 or 150-1. When the first voltage value and the first current value are constantly applied, if the impurity densities of the first semiconductor layers 147 and the third semiconductor layer 150 or 150-1 are large, an etching speed may fast. When the impurity densities of the first semiconductor layers 147 and the third semiconductor layer 150 or 150-1 are constant, if the first voltage value and the first current value are large, an etching speed may fast.

With respect to FIG. 17, a second voltage value and a second current value, which are respectively less than the first voltage value and the first current value, are applied between the third semiconductor layer pattern 152 and the opposite electrode 300. In this case, vacancies are formed in the third semiconductor layer pattern 152 and conductivity is removed from the third semiconductor layer pattern 152, thereby changing the third semiconductor layer pattern 152 to the porous insulating layer 155. The second voltage value and the second current value may be determined according to an impurity density of the third semiconductor layer pattern 152. When the second voltage value and the second current value are constantly applied, if the impurity density of the third semiconductor layer pattern 152 is large, the third semiconductor layer pattern 152 may be quickly changed to the porous insulating layer 155. When the impurity density of the third semiconductor layer pattern 152 is constant, if the second voltage value and the second current value are large, the third semiconductor layer pattern 152 may be quickly changed to the porous insulating layer 155.

Referring to FIG. 18, the reflection metal layer 160 acting as the first electrode may be formed by covering the exposed first semiconductor layers 147 of the 3D light-emitting structures 140 and being electrically connected to the first semiconductor layers 147. The reflection metal layer 160 may be formed to cover the 3D light-emitting structures 140 and may be formed with a proper thickness so as to have an uneven structure according to a protruding structure of the 3D light-emitting structures 140.

The thick-film metal layer 170 may be further formed on the reflection metal layer 160. The thick-film metal layer 170 may be formed by electroplating. The thick-film metal layer 170 may be formed more thicker than the reflection metal layer 160 and may have a flat surface through a surface polishing process. The thick-film metal layer 170, i.e., an electroplating layer, may be used as the first electrode all over the entire upper surface of the 3D light-emitting device 100.

Thereafter, a portion of the second semiconductor layer 120, which corresponds to a location at which the second electrode 180 is to be formed, is exposed by etching the thick-film metal layer 170, the reflection metal layer 160, the porous insulating layer 155, and the mask layer 130 by wet and dry etching methods.

Thereafter, by forming the second electrode 180, e.g., an n electrode, on the exposed surface of the second semiconductor layer 120m as shown in FIG. 1, a structure where the second electrode 180 is electrically connected to the semiconductor cores 141 may be obtained.

Thereafter, the 3D light-emitting device 100 may be completely manufactured by an annealing process and the like. In addition, a final light-emitting device chip may be manufactured by a post-fabrication process, i.e., a wafer thinning process, a dicing process, and the like.

Methods of fabricating the 3D light-emitting devices 100-1, 100-2, 100-3, 100-4, 100-5, 100-6, 100-7, 100-8, 10-9a, 100-9b, 100-10a, 100-10b, 100-11a, 100-11b, 100-12a, and 100-12b of FIGS. 2 to 13B will now be described. Hereinafter, only two 3D light-emitting structures 140 are illustrated, and a vertical cross-section of one of the two 3D light-emitting structures 140 has a triangular shape.

Figure 20A:
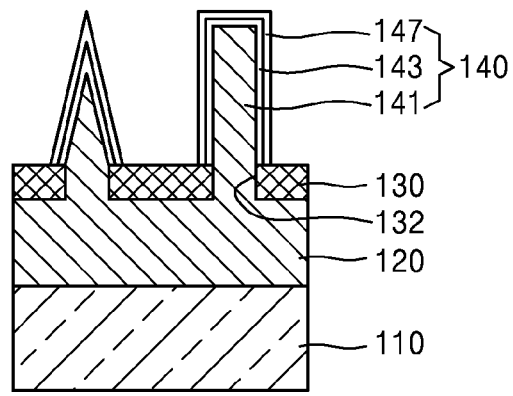
FIGS. 20A to 20C are cross-sectional diagrams for describing a method of fabricating the 3D light-emitting device in FIG. 2, according to another embodiment of the inventive concept.
Figure 20B:
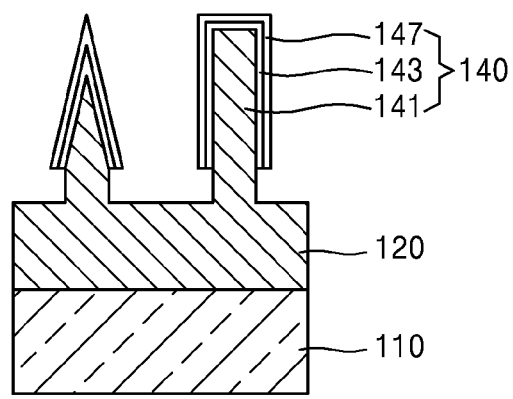
Figure 20C:
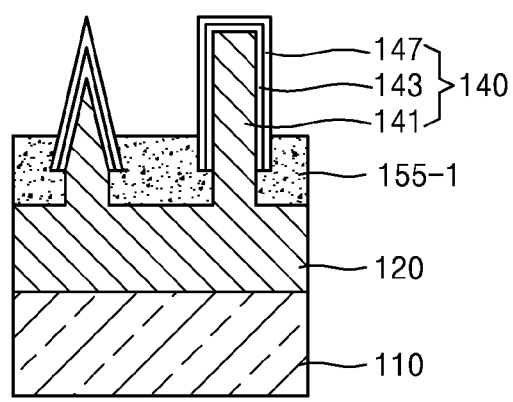

FIGS. 20A to 20C are cross-sectional diagrams for describing a method of fabricating the 3D light-emitting device 100-1 in FIG. 2, according to another embodiment of the inventive concept.

Referring to FIG. 20A, as shown in FIGS. 14 to 15B, the mask layer 130 may be formed on the substrate 110, on which the second semiconductor layer 120 is formed, and has the through-holes 132. The semiconductor cores 141 may be vertically grown through the through-holes 132 formed in the mask layer 130, respectively. The active layers 143 may be respectively formed so as to surround the surfaces of the semiconductor cores 141. The 3D light-emitting structures 140 may be formed by forming the first semiconductor layers 147 so as to respectively surround the surfaces of the active layers 143.

Referring to FIG. 20B, the mask layer 130 is removed by etching. In this case, the lower corner portions of the 3D light-emitting structures 140, the lower corner portions of the semiconductor cores 141, and the upper surface of the second semiconductor layer 120 may be exposed. Particularly, the lower corner portions of the first semiconductor layers 147 and the active layers 143 may be exposed.

Referring to FIG. 20C, the porous insulating layer 155-1 may be formed on the lower corner portions of the 3D light-emitting structures 140, on the lower corner portions of the semiconductor cores 141, and on the upper surface of the second semiconductor layer 120. The porous insulating layer 155-1 may be formed by the same method as the method of forming the porous insulating layer 155 in FIGS. 15A to 17 and 19.

Thereafter, the 3D light-emitting device 100-1 may be completed by forming the reflection metal layer 160 and the thick-film metal layer 170, as shown in FIG. 18, and forming the second electrode 180, as shown in FIG. 2.

FIGS. 21A to 21D are cross-sectional diagrams for describing a method of fabricating the 3D light-emitting device 100-2 in FIG. 3, according to another embodiment of the inventive concept.

Figure 21A:
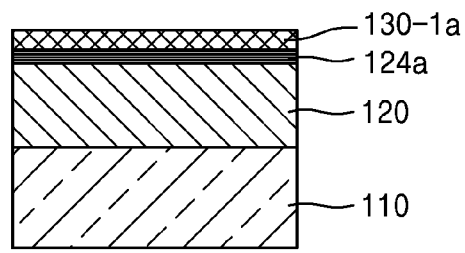
FIGS. 21A to 21D are cross-sectional diagrams for describing a method of fabricating the 3D light-emitting device in FIG. 3, according to another embodiment of the inventive concept.
Figure 21B:
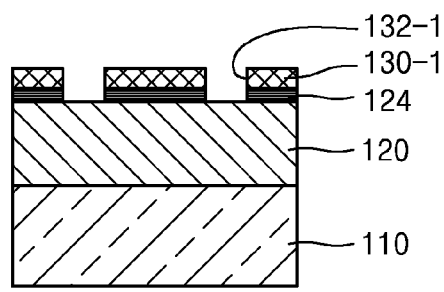

Referring to FIGS. 21A and 21B, the second semiconductor layer 120, an etching prevention material layer 124a, and a mask material layer 130-1a may be formed on the substrate 110 as shown in FIG. 21A. The mask material layer 130-1a is a material that is to be the mask layer 130-1 later. The etching prevention material layer 124a may be formed of various materials having an etching selection ratio that is higher than that of the mask material layer 130-1a.

Thereafter, as shown in FIG. 21B, the mask layer 130-1 is formed by patterning the mask material layer 130-1a and thus has the through holes 132-1. Since the etching prevention layer 124 may function to prevent the second semiconductor layer 120 from being etched in an etching process for patterning the mask material layer 130-1a, the through holes 132-1 may be more accurately formed.

Thereafter, the etching prevention layer 124 may be formed by etching the etching prevention material layer 124a by using the mask layer 130-1 having the through holes 132-1 as an etching mask. The surface of the second semiconductor layer 120 may be exposed by forming the etching prevention layer 124.

Figure 21C:
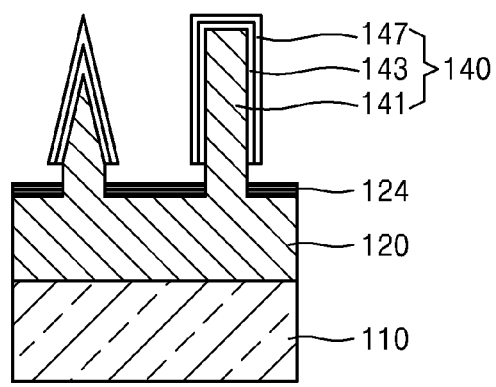

Referring to FIG. 21C, the semiconductor cores 141 may be vertically grown through the through holes 132-1 formed in the mask layer 130-1, as shown in FIGS. 14 to 15B. As described above, since the through holes 132-1 have been accurately formed, the heights and uniformity of the semiconductor cores 141 may be accurately formed. The active layers 143 may be formed so as to respectively surround the surfaces of the semiconductor cores 141. The 3D light-emitting structures 140 may be formed by forming the first semiconductor layers 147 so as to respectively surround the surfaces of the active layers 143.

Thereafter, the mask layer 130-1 is removed by etching. In this case, the lower corner portions of the 3D light-emitting structures 140, the lower corner portions of the semiconductor cores 141, and the upper surface of the second semiconductor layer 120 may be exposed. Particularly, the lower corner portions of the first semiconductor layers 147 and the active layers 143 may be exposed.

Figure 21D:
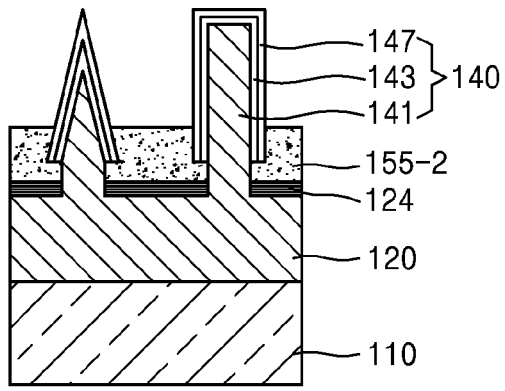

Referring to FIG. 21D, the porous insulating layer 155-2 may be formed on the lower corner portions of the 3D light-emitting structures 140, on the lower corner portions of the semiconductor cores 141, and on the upper surface of the second semiconductor layer 120. The porous insulating layer 155-2 may be formed by the same method as the method of forming the porous insulating layer 155 described with reference to FIGS. 15A to 17 and 19.

Thereafter, the 3D light-emitting device 100-2 may be completed by forming the reflection metal layer 160 and the thick-film metal layer 170, as shown in FIG. 18, and forming the second electrode 180, as shown in FIG. 3.

Figure 22A:
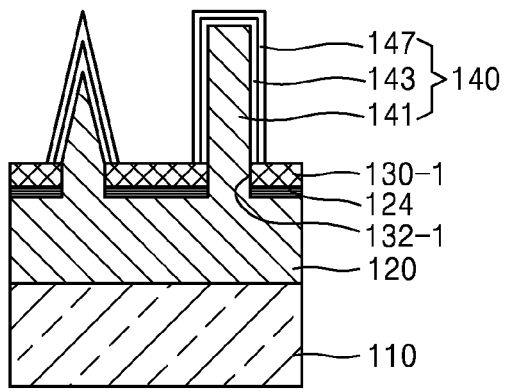
FIGS. 22A and 22B are cross-sectional diagrams for describing a method of fabricating the 3D light-emitting device in FIG. 4, according to another embodiment of the inventive concept.
Figure 22B:
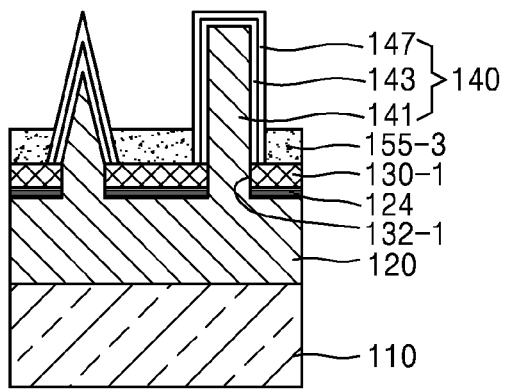

FIGS. 22A and 22B are cross-sectional diagrams for describing a method of fabricating the 3D light-emitting device 100-3 in FIG. 4, according to another embodiment of the inventive concept.

Referring to FIG. 22A, the semiconductor cores 141 may be vertically grown through the through holes 132-1 formed in the mask layer 130-1 on the etching prevention layer 124, as shown in FIGS. 21A to 21C. The active layers 143 may be formed so as to respectively surround the surfaces of the semiconductor cores 141. The 3D light-emitting structures 140 may be formed by forming the first semiconductor layers 147 so as to respectively surround the surfaces of the active layers 143. In this case, the lower corner portions of the 3D light-emitting structures 140 and the upper surface of the mask layer 130-1 may be exposed.

Referring to FIG. 22B, the porous insulating layer 155-3 may be formed on the lower corner portions of the 3D light-emitting structures 140 and on the upper surface of the mask layer 130-1. The porous insulating layer 155-3 may be formed by the same method as the method of forming the method of forming the porous insulating layer 155 described with reference to FIGS. 15A to 17 and 19.

Thereafter, the 3D light-emitting device 100-3 may be completed by forming the reflection metal layer 160 and the thick-film metal layer 170, as shown in FIG. 18, and forming the second electrode 180, as shown in FIG. 4.

FIGS. 23A to 23D are cross-sectional diagrams for describing a method of fabricating the 3D light-emitting device 100-4 in FIG. 5, according to another embodiment of the inventive concept.

Figure 23A:
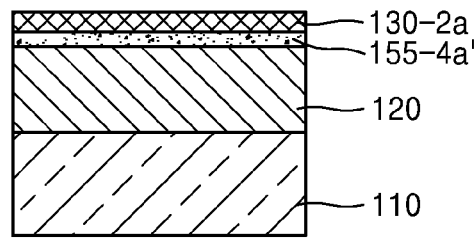
FIGS. 23A to 23D are cross-sectional diagrams for describing a method of fabricating the 3D light-emitting device in FIG. 5, according to another embodiment of the inventive concept.

Referring to FIG. 23A, the second semiconductor layer 120, a second porous insulating material layer 155-4a', and a mask material layer 130-2a may be formed on the substrate 110. The second porous insulating material layer 155-4a' is a material that is to be the second porous insulating layer 155-4a. The second porous insulating material layer 155-4a' may be formed by the same method as the method of forming the porous insulating material layer 155 described with reference to FIGS. 15A to 17 and 19. The mask material layer 130-2a is a material that is to be the mask layer 130-2 later.

Figure 23B:
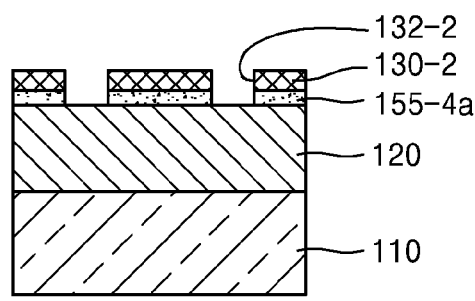

Referring to FIG. 23B, the mask layer 130-2 is formed by patterning the mask material layer 130-2a and thus has the through holes 132-2. Thereafter, the second porous insulating layer 155-4a may be formed by etching the second porous insulating material layer 155-4a' by using the mask layer 130-2 having the through holes 132-2 as an etching mask. The surface of the second semiconductor layer 120 may be exposed by forming the second porous insulating layer 155-4a.

Figure 23C:
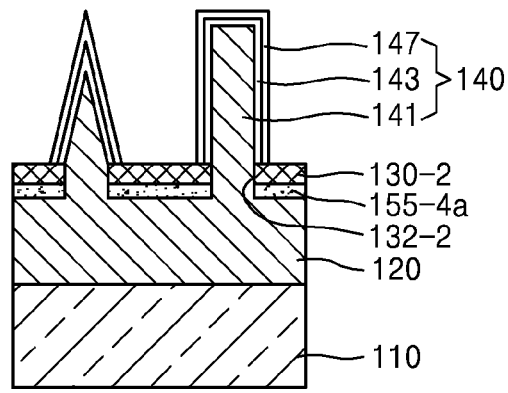

Referring to FIG. 23C, the 3D light-emitting structures 140 may be formed through the through holes 132-2 formed in the mask layer 130-2. In this case, the lower corner portions of the 3D light-emitting structures 140 and the upper surface of the second semiconductor layer 120 may be exposed.

Figure 23D:
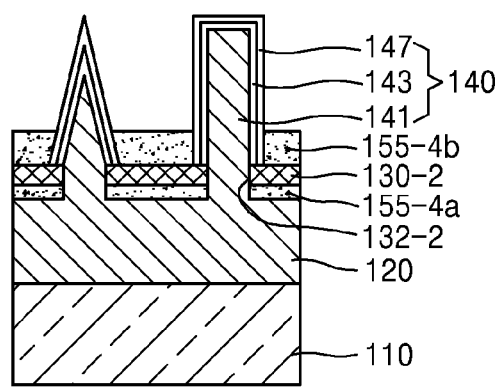

Referring to FIG. 23D, the first porous insulating layer 155-4b may be formed on the lower corner portions of the 3D light-emitting structures 140 and on the upper surface of the second semiconductor layer 120. The first porous insulating layer 155-4b may be formed by the same method as the method of forming the porous insulating layer 155 described with reference to FIGS. 15A to 17 and 19.

Thereafter, the 3D light-emitting device 100-4 may be completed by forming the reflection metal layer 160 and the thick-film metal layer 170, as shown in FIG. 18, and forming the second electrode 180, as shown in FIG. 5.

FIGS. 24A to 24D are cross-sectional diagrams for describing a method of fabricating the 3D light-emitting device 100-5 in FIG. 6, according to another embodiment of the inventive concept.

Figure 24A:
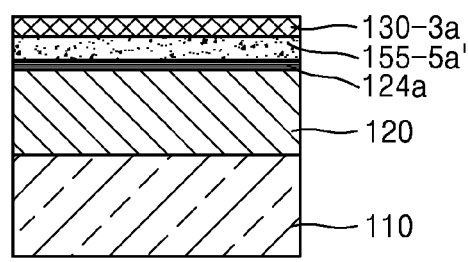
FIGS. 24A to 24D are cross-sectional diagrams for describing a method of fabricating the 3D light-emitting device in FIG. 6, according to another embodiment of the inventive concept.

Referring to FIG. 24A, the second semiconductor layer 120, the etching prevention material layer 124a, a second porous insulating material layer 155-5a', and a mask material layer 130-3a may be formed on the substrate 110. The etching prevention material layer 124a is a material that is to be the etching prevention layer 124. The second porous insulating material layer 155-5a' is a material that is to be the second porous insulating layer 155-5a. The second porous insulating material layer 155-5a' may be formed by the same method as the method of forming the porous insulating material layer 155 described with reference to FIGS. 15A to 17 and 19. The mask material layer 130-3a is a material that is to be the mask layer 130-3 later.

Figure 24B:
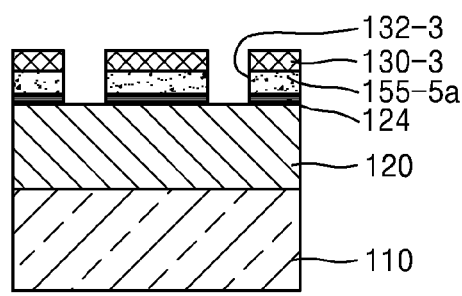

Referring to FIG. 24B, the mask layer 130-3 is formed by patterning the mask material layer 130-3a and thus has the through holes 132-3. Thereafter, the second porous insulating layer 155-5a and the etching prevention layer 124 may be formed by sequentially etching the second porous insulating material layer 155-5a' and the etching prevention material layer 124a by using the mask layer 130-3 having the through holes 132-3 as an etching mask. The second porous insulating layer 155-5a may be more accurately formed due to the etching prevention layer 124. The surface of the second semiconductor layer 120 may be exposed by forming the second porous insulating layer 155-5a and the etching prevention layer 124.

Figure 24C:
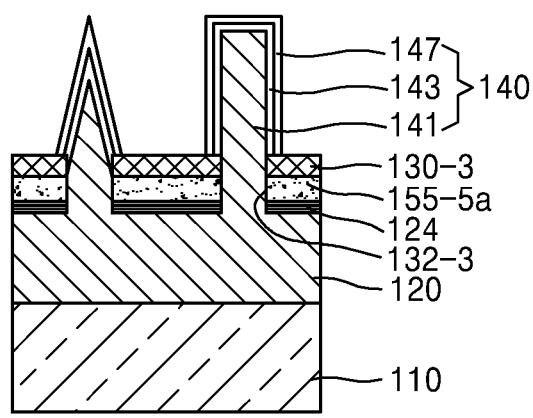

Referring to FIG. 24C, the 3D light-emitting structures 140 may be formed through the through holes 132-3 formed in the mask layer 130-3. In this case, the lower corner portions of the 3D light-emitting structures 140 and the upper surface of the mask layer 130-3 may be exposed.

Figure 24D:
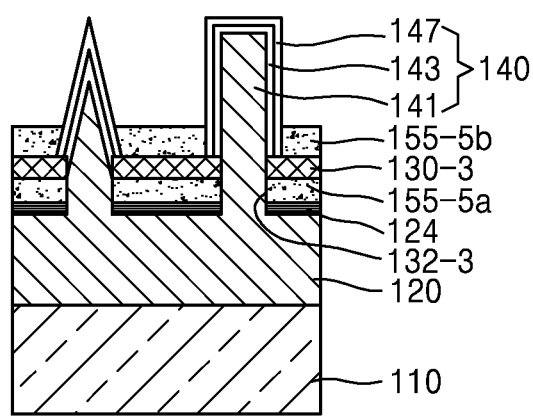

Referring to FIG. 24D, the first porous insulating layer 155-5b may be formed on the lower corner portions of the 3D light-emitting structures 140 and on the upper surface of the mask layer 130-3. The first porous insulating layer 155-5b may be formed by the same method as the method of forming the porous insulating layer 155 described with reference to FIGS. 15A to 17 and 19.

Thereafter, the 3D light-emitting device 100-5 may be completed by forming the reflection metal layer 160 and the thick-film metal layer 170, as shown in FIG. 18, and forming the second electrode 180, as shown in FIG. 6.

Since the 3D light-emitting devices 100-6, 100-7, 100-8, 100-9a, 100-9b, 100-10a, and 100-10b of FIGS. 7 to 11B may be readily fabricated by using the fabricating methods described above, a detailed description thereof is omitted.

Figure 25:
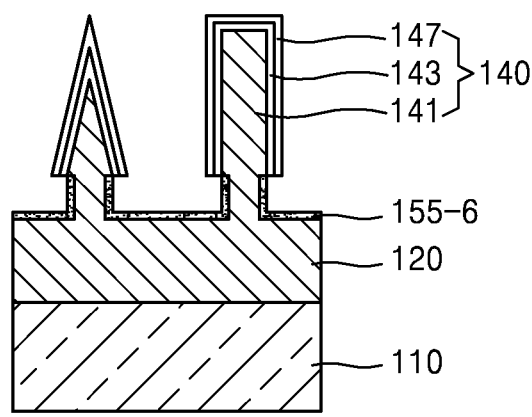
FIG. 25 is a cross-sectional diagram for describing a method of fabricating the 3D light-emitting devices in FIGS. 12A and 12B, according to another embodiment of the inventive concept.
Figure 27:
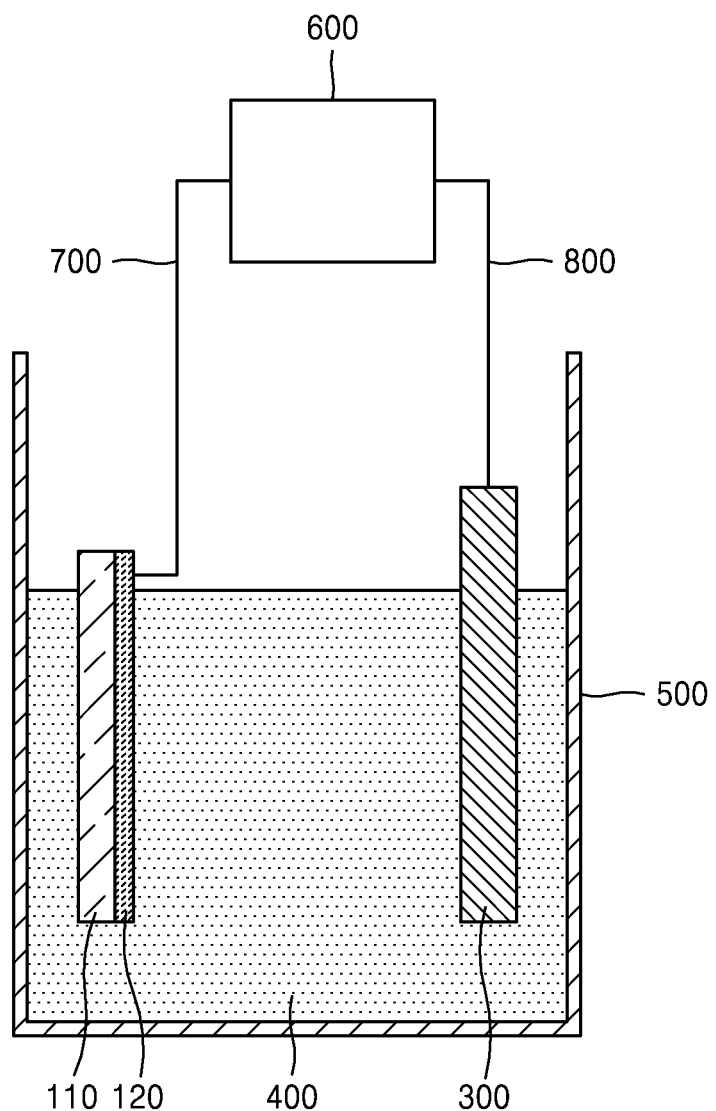
FIG. 27 is a schematic diagram of an electrochemical etching apparatus used to fabricate the 3D light-emitting devices in FIGS. 12A to 13B, according to another embodiment of the inventive concept.

FIG. 25 is a cross-sectional diagram for describing a method of fabricating the 3D light-emitting devices 100-11a and 100-11b in FIGS. 12A and 12B, according to another embodiment of the inventive concept, and FIG. 27 is a schematic diagram of an electrochemical etching apparatus used to fabricate the 3D light-emitting devices 100-11a and 100-11b in FIGS. 12A and 12B, according to another embodiment of the inventive concept.

In detail, the same fabricating processes as shown in FIGS. 20A and 20B are performed. That is, as shown in FIGS. 20A and 20B, the 3D light-emitting structures 140 are formed on the substrate 110, on which the second semiconductor layer 120 is formed, and the mask layer 130 is removed by etching. In this case, the lower corner portions of the 3D light-emitting structures 140, the lower corner portions of the semiconductor cores 141, and the upper surface of the second semiconductor layer 120 may be exposed.

Thereafter, referring to FIG. 25, the porous insulating layer 155-6 may be formed on the lower corner portions of the 3D light-emitting structures 140, on the lower corner portions of the semiconductor cores 141, and on the upper surface of the second semiconductor layer 120.

A method of forming the porous insulating layer 155-6 will now be described by using the electrochemical etching apparatus of FIG. 27. The electrochemical etching apparatus of FIG. 27 is the same as the electrochemical etching apparatus of FIG. 19 except that the substrate 110, on which the second semiconductor layer 120 is formed, is inside the etching bath 500. A proper voltage value and a proper current value are applied between the second semiconductor layer 120 and the opposite electrode 300. In this case, vacancies are formed on the surface of the second semiconductor layer 120 and on the lower corner portions and both side walls of the semiconductor cores 141, and conductivity is removed therefrom, thereby changing the upper portion of the second semiconductor layer 120 to the porous insulating layer 155-6. The proper voltage value and the proper current value may be determined according to the impurity density of the second semiconductor layer 120. When a constant voltage value and a constant current value are applied, if the impurity density of the second semiconductor layer 120 is large, the porous insulating layer 155-6 may be more quickly formed.

Thereafter, as shown in FIGS. 12A and 12B, the transparent electrode layer 162 or the reflection electrode layer 172 is formed. Unlike FIG. 12A, in FIG. 12B, holes h may be formed since the transparent electrode layer 162 or the reflection electrode layer 172 is not filled in the lower corner portions of the semiconductor cores 141. Thereafter, as shown in FIGS. 12A and 12B, the 3D light-emitting devices 100-11a and 100-11b may be completed by forming the first electrode 170 and the second electrode 180.

Figure 26:
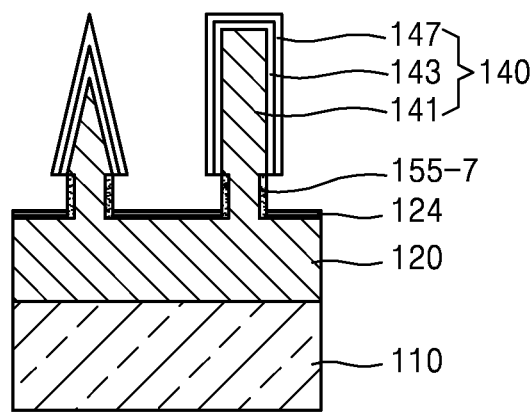
FIG. 26 is a cross-sectional diagram for describing a method of fabricating the 3D light-emitting devices in FIGS. 13A and 13B, according to another embodiment of the inventive concept.

FIG. 26 is a cross-sectional diagram for describing a method of fabricating the 3D light-emitting devices 100-12a and 100-12b in FIGS. 13A and 13B, according to another embodiment of the inventive concept.

In detail, the same fabricating processes as shown in FIGS. 21A to 21C are performed. That is, as shown in FIGS. 21A to 21C, the 3D light-emitting structures 140 are formed on the substrate 110, on which the second semiconductor layer 120 and the etching prevention layer 124 are formed, and the mask layer 130 is removed by etching. In this case, the lower corner portions of the 3D light-emitting structures 140, the lower corner portions of the semiconductor cores 141, and the upper surface of the etching prevention layer 124 may be exposed.

Thereafter, referring to FIG. 26, the porous insulating layer 155-7 may be formed on the lower corner portions of the 3D light-emitting structures 140 or on the lower corner portions of the semiconductor cores 141. A method of forming the porous insulating layer 155-7 will now be described by using the electrochemical etching apparatus of FIG. 27. The electrochemical etching apparatus of FIG. 27 is the same as the electrochemical etching apparatus of FIG. 19 except that the substrate 110, on which the second semiconductor layer 120 is formed, is inside the etching bath 500. A proper voltage value and a proper current value are applied between the second semiconductor layer 120 and the opposite electrode 300. In this case, vacancies are formed on the lower corner portions and both side walls of the semiconductor cores 141 connected to the second semiconductor layer 120 through the etching prevention layer 124, and the conductivity is removed therefrom to form the porous insulating layer 155-7. The proper voltage value and the proper current value may be determined according to the impurity density of the second semiconductor layer 120. When a constant voltage value and a constant current value are applied, if the impurity density of the second semiconductor layer 120 is large, the porous insulating layer 155-7 may be more quickly formed.

Thereafter, as shown in FIGS. 13A and 13B, the transparent electrode layer 162 or the reflection electrode layer 172 is formed. Unlike FIG. 13A, in FIG. 13B, holes h may be formed since the transparent electrode layer 162 or the reflection electrode layer 172 is not filled in the lower corner portions of the semiconductor cores 141. Thereafter, as shown in FIGS. 13A and 13B, the 3D light-emitting devices 100-12a and 100-12b may be completed by forming the first electrode 170 and the second electrode 180.

The above-described method of fabricating the 3D light-emitting device 100, 100-1, 100-2, 100-3, 100-4, 100-5, 100-6, 100-7, 100-8, 100-9a, 100-9b, 100-10a, and 100-10b, 100-11a, 100-11b, 100-12a, or 100-12b may include: forming the 3D light-emitting structures 140; forming the porous insulating layer 155, 155-1, 155-2, 155-3, 155-4a, 155-4b, 155-5a, 155-5b, 155-6, or 155-7 between the lower corner portions of the 3D light-emitting structures 140 or the semiconductor cores 141 by electrochemical etching; forming the first electrode electrically connected to the first semiconductor layers 147; and forming the second electrode 180 electrically connected to the semiconductor cores 141.

The forming of the porous insulating layer 155, 155-1, 155-2, 155-3, 155-4a, 155-4b, 155-5a, or 155-5b may include: forming a third semiconductor layer 150 or 150-1, which covers the 3D light-emitting structures 140 immediately after forming the 3D light-emitting structures 140 and has impurity density that is higher than that of the first semiconductor layers 147; forming the third semiconductor layer pattern 152, which fills between the lower corner portions of the 3D light-emitting structures 140 or the semiconductor cores 141 and exposes the upper end portions thereof, by electrochemically etching the third semiconductor layer 150 or 150-1; and changing the third semiconductor layer pattern 152 to the porous insulating layer 155, 155-1, 155-2, 155-3, 155-4a, 155-4b, 155-5a, or 155-5b by electrochemically etching the third semiconductor layer pattern 152. An extent of exposing the upper end portions of the 3D light-emitting structures 140 may be adjusted according to a voltage value and a current value applied in the electrochemical etching.

The forming of the porous insulating layer 155-6 or 155-7 may include: forming the 3D light-emitting structures 140; and forming the porous insulating layer 155-6 or 155-7 between the lower corner portions of the 3D light-emitting structures 140 or the semiconductor cores 141 by electrochemically etching one surface of the second semiconductor layer 120.

While the inventive concept has been particularly shown and described with reference to exemplary embodiments thereof, it will be understood that various changes in form and details may be made therein without departing from the spirit and scope of the following claims.

What is claimed is:

1. A three-dimensional (3D) light-emitting device comprising:
    a plurality of 3D light-emitting structures formed apart from one another, each 3D light-emitting structure comprising a semiconductor core vertically grown on one surface and doped in a first conductive type, an active layer formed so as to surround a surface of the semiconductor core, and a first semiconductor layer formed so as to surround a surface of the active layer and doped in a second conductive type;
    a first porous insulating layer formed between lower corner portions of the 3D light-emitting structures so as to expose upper end portions of the 3D light-emitting structures;
    a first electrode electrically connected to the first semiconductor layer; and
    a second electrode electrically connected to the semiconductor core.

2. The 3D light-emitting device of claim 1, further comprising a mask layer having a plurality of through-holes formed apart from one another,
    wherein the semiconductor core is grown in the vertical direction through its corresponding through-hole.

3. The 3D light-emitting device of claim 2, wherein a first etching prevention layer is formed below the mask layer.

4. The 3D light-emitting device of claim 2, wherein a second porous insulating layer is formed below the mask layer.

5. The 3D light-emitting device of claim 4, wherein a second etching prevention layer is formed below the second porous insulating layer.

6. The 3D light-emitting device of claim 1, wherein a reflection metal layer or a transparent electrode layer is formed so as to cover the first semiconductor layer forming the 3D light-emitting structure.

7. The 3D light-emitting device of claim 1, wherein the first porous insulating layer is formed by being filled between the lower corner portions of the 3D light-emitting structures or is formed on lower one-side walls of the 3D light-emitting structures.

8. The 3D light-emitting device of claim 1, wherein the semiconductor core is vertically grown on the surface of a second semiconductor layer doped in the first conductive type.

9. The 3D light-emitting device of claim 8, wherein a reflection metal layer is formed below the second semiconductor layer.

10. The 3D light-emitting device of claim 8, wherein the second semiconductor layer is formed on a first substrate.

11. The 3D light-emitting device of claim 10, wherein the components formed on the first substrate are flip-chip bonded onto a second substrate by turning the first substrate over.

12. The 3D light-emitting device of claim 10, wherein an uneven structure is formed on the second semiconductor layer between the first substrate and the second semiconductor layer.

13. A three-dimensional (3D) light-emitting device comprising:
    a plurality of 3D light-emitting structures formed apart from one another and exposing lower corner portions of semiconductor cores, each 3D light-emitting structure comprising a semiconductor core vertically grown on one surface and doped in a first conductive type, an active layer formed so as to surround a surface of the semiconductor core, and a first semiconductor layer formed so as to surround a surface of the active layer and doped in a second conductive type;
    a porous insulating layer formed between lower corner portions of the 3D light-emitting structures, which include the exposed lower corner portions of the semiconductor cores, so as to expose upper end portions of the 3D light-emitting structures;
    a first electrode electrically connected to the first semiconductor layer; and
    a second electrode electrically connected to the semiconductor core.

14. The 3D light-emitting device of claim 13, wherein an etching prevention layer is formed below the porous insulating layer.

15. The 3D light-emitting device of claim 13, wherein a vertical cross-section of the 3D light-emitting structure has a triangular or quadrangular shape.

16. A method of fabricating a (3D) light-emitting device, the method comprising:
    forming a plurality of 3D light-emitting structures apart from one another, each 3D light-emitting structure comprising a semiconductor core vertically grown on one surface and doped in a first conductive type, an active layer formed so as to surround a surface of the semiconductor core, and a first semiconductor layer formed so as to surround a surface of the active layer and doped in a second conductive type;
    forming a first porous insulating layer between lower corner portions of the 3D light-emitting structures in an electrochemical method so as to expose upper end portions of the 3D light-emitting structures;
    forming a first electrode electrically connected to the first semiconductor layer; and
    forming a second electrode electrically connected to the semiconductor core.

17. The method of claim 16, wherein the semiconductor core is formed by forming a mask layer having a plurality of through-holes formed on the one surface and apart from one another and growing a semiconductor core material in the vertical direction through the through-holes.

18. The method of claim 16, wherein a first etching prevention layer is further formed below the mask layer.

19. The method of claim 16, wherein a second porous insulating layer is further formed below the mask layer.

20. The method of claim 19, wherein a second etching prevention layer is further formed below the second porous insulating layer.

21. The method of claim 16, wherein a reflection metal layer or a transparent electrode layer is further formed so as to cover the first semiconductor layer forming the 3D light-emitting structure.

22. The method of claim 16, wherein the first porous insulating layer is formed by being filled between the lower corner portions of the 3D light-emitting structures or formed on lower one-side walls of the 3D light-emitting structures.

23. The method of claim 16, wherein the semiconductor core is vertically grown on the surface of a second semiconductor layer doped in the first conductive type.

24. The method of claim 23, wherein a reflection metal layer is further formed below the second semiconductor layer.

25. The method of claim 23, wherein the second semiconductor layer is formed on a first substrate.

26. The method of claim 25, wherein the components formed on the first substrate are flip-chip bonded onto a second substrate by turning the first substrate over.

27. The method of claim 25, wherein an uneven structure is formed on the second semiconductor layer between the first substrate and the second semiconductor layer.

28. The method of claim 16, wherein the forming of the first porous insulating layer comprises:
    forming a third semiconductor layer, which covers the 3D light-emitting structures and is doped with impurities having an impurity density that is higher than that of the first semiconductor layer;
    forming a third semiconductor layer pattern doped with impurities so as to fill between the lower corner portions of the 3D light-emitting structures and expose the upper end portions of the 3D light-emitting structures by electrochemically etching the third semiconductor layer doped with impurities; and
    changing the third semiconductor layer pattern doped with impurities to the first porous insulating layer by electrochemically etching the third semiconductor layer pattern doped with impurities.

29. The method of claim 28, wherein an extent of exposing the upper end portions of the 3D light-emitting structures by etching the third semiconductor layer doped with impurities is adjusted according to the impurity density of the third semiconductor layer and a voltage value and a current value applied in the electrochemical etching.

* * * * *